(12) United States Patent
Keum et al.

(10) Patent No.: US 11,871,622 B2
(45) Date of Patent: Jan. 9, 2024

(54) DISPLAY DEVICE

(71) Applicant: SAMSUNG DISPLAY CO., LTD., Yongin-si (KR)

(72) Inventors: Nackhyeon Keum, Yongin-si (KR); Jihyun Ka, Yongin-si (KR); Haeyeon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/697,188

(22) Filed: Mar. 17, 2022

(65) Prior Publication Data

US 2022/0384548 A1 Dec. 1, 2022

(30) Foreign Application Priority Data

May 31, 2021 (KR) .................... 10-2021-0070112

(51) Int. Cl.
| | |
|---|---|
| *G09G 3/3233* | (2016.01) |
| *H10K 59/123* | (2023.01) |
| *H10K 59/121* | (2023.01) |
| *H01L 27/12* | (2006.01) |

(52) U.S. Cl.
CPC ......... *H10K 59/123* (2023.02); *G09G 3/3233* (2013.01); *H10K 59/1213* (2023.02); *G09G 2300/0842* (2013.01); *G09G 2340/0435* (2013.01); *H01L 27/124* (2013.01)

(58) Field of Classification Search
CPC ......... G09G 3/3233; G09G 2300/0842; G09G 2340/0435
See application file for complete search history.

(56) References Cited

U.S. PATENT DOCUMENTS

| | | | |
|---|---|---|---|
| 11,489,007 B2* | 11/2022 | Yang | G06F 1/1686 |
| 2018/0190750 A1 | 7/2018 | Choi et al. | |
| 2019/0140025 A1* | 5/2019 | Wang | H01L 27/3218 |
| 2020/0168164 A1* | 5/2020 | Park | G09G 3/3291 |
| 2020/0176527 A1 | 6/2020 | An et al. | |
| 2020/0213514 A1 | 7/2020 | Kim et al. | |
| 2021/0066427 A1* | 3/2021 | Ma | H01L 27/3246 |
| 2022/0102421 A1* | 3/2022 | Yang | H10K 59/353 |

FOREIGN PATENT DOCUMENTS

| | | |
|---|---|---|
| EP | 1679687 B1 | 6/2012 |
| EP | 3267433 A1 | 10/2018 |
| EP | 3633660 A1 | 4/2020 |
| EP | 3825993 A1 | 5/2021 |
| KR | 1020040033395 A | 4/2004 |
| KR | 1020180080741 A | 7/2018 |
| KR | 1020200066502 A | 6/2020 |
| KR | 1020200079868 A | 7/2020 |
| KR | 1020200080925 A | 7/2020 |

* cited by examiner

*Primary Examiner* — Kevin M Nguyen
(74) *Attorney, Agent, or Firm* — CANTOR COLBURN LLP

(57) ABSTRACT

A display device includes a first light-emitting element disposed in a first display area, a second light-emitting element disposed in a second display area, a first pixel circuit disposed in the first display area, where the first pixel circuit output a first driving current for driving at least one selected from the first light-emitting element and the second light-emitting element, a first emission control transistor which connects the first pixel circuit to the first light-emitting element, and a second emission control transistor which connects the first pixel circuit to the second light-emitting element.

19 Claims, 10 Drawing Sheets

DISPLAY DEVICE

This application claims priority to Korean Patent Application No. 10-2021-0070112, filed on May 31, 2021, and all the benefits accruing therefrom under 35 U.S.C. § 119, the content of which in its entirety is herein incorporated by reference.

BACKGROUND

1. Field

One or more embodiments relate to a display device, and more particularly, to a display device in which a display area is enlarged so that an image may be displayed even in an area where a component, which is an electronic element, is arranged.

2. Description of the Related Art

Recently, display devices are widely used in various fields. Also, as the thicknesses and weights of the display devices have decreased, the range of applications of the display devices has increased.

As the display devices are used for various purposes, various methods may be used to design the shapes of the display devices, and the number of functions which may be connected to or associated with the display devices has increased.

SUMMARY

One or more embodiments provide a display device in which a display area is enlarged so that an image may be displayed even in an area where a component, which is an electronic element, is arranged.

According to an embodiment, a display device includes a first light-emitting element disposed in a first display area, a second light-emitting element disposed in a second display area, a first pixel circuit disposed in the first display area, wherein the first pixel circuit outputs a first driving current for driving at least one selected from the first light-emitting element and the second light-emitting element, a first emission control transistor which connects the first pixel circuit to the first light-emitting element, and a second emission control transistor which connects the first pixel circuit to the second light-emitting element.

According to an embodiment, the first emission control transistor and the second emission control transistor may be disposed in the first display area.

According to an embodiment, the first light-emitting element and the second light-emitting element may emit light of a same color.

According to an embodiment, in a first operation mode, the first light-emitting element may emit light in response to the first driving current supplied through the first emission control transistor, and in a second operation mode, the second light-emitting element may emit light in response to the first driving current supplied through the second emission control transistor.

According to an embodiment, the display device may operate in one of the first operation mode and the second operation mode in an odd-numbered frame and operate in the other of the first operation mode and the second operation mode in an even-numbered frame.

According to an embodiment, the display device may further include a gate driver which outputs a first emission control signal in the first operation mode and outputs a second emission control signal in the second operation mode.

According to an embodiment, the first pixel circuit may include a first driving transistor which controls an amplitude of the first driving current based on a gate-source voltage, the first emission control transistor may connect the first driving transistor to the first light-emitting element in response to the first emission control signal, and the second emission control transistor may connect the first driving transistor to the second light-emitting element in response to the second emission control signal.

According to an embodiment, the first pixel circuit may further include a first operation control transistor which connects a power line to the first driving transistor in response to the first emission control signal, where the power line may transmit a driving voltage, and a second operation control transistor which connects the power line to the first driving transistor in response to the second emission control signal.

According to an embodiment, the first pixel circuit may further include a scan transistor which transmits a data voltage to the first driving transistor in response to a first scan signal, and a storage capacitor connected to the first driving transistor.

According to an embodiment, the first pixel circuit may further include an operation control transistor which connects a power line to the first driving transistor in response to a third emission control signal, where the power line may transmit a driving voltage.

According to an embodiment, the third emission control signal may be synchronized with at least one selected from the first emission control signal and the second emission control signal.

According to an embodiment, the display device may further include a third light-emitting element disposed in a third display area, and a second pixel circuit arranged in the third display area, where the second pixel may output a second driving current for driving the third light-emitting element.

According to an embodiment, the display device may further include a component disposed under the second display area, and the component may include a camera or a sensor.

According to an embodiment, the first display area may be between the second display area and the third display area.

According to an embodiment, the display device may further include a third emission control transistor disposed in the third display area, where the third emission control transistor may connect the second pixel circuit to the third light-emitting element.

According to an embodiment, a frame rate of the third display area may be equal to a sum of a frame rate of the first display area and a frame rate of the second display area.

According to an embodiment, a substrate on which a first display area, a second display area, and a third display area are defined, where the second display area may be disposed inwardly from the first display area, and the third display area may be disposed outwardly from the first display area, a first pixel circuit disposed on substrate in the first display area, a first emission control transistor electrically connected to the first pixel circuit, and a second emission control transistor electrically connected to the first pixel circuit.

According to an embodiment, the first emission control transistor and the second emission control transistor may be disposed on the substrate in the first display area.

According to an embodiment, the display device may further include a first light-emitting element disposed on the substrate in the first display area, and a second light-emitting element disposed on the substrate in the second display area, where the first emission control transistor may connect the first pixel circuit to the first light-emitting element, and the second emission control transistor may connect the first pixel circuit to the second light-emitting element.

According to an embodiment, the display device may further include a second pixel circuit disposed on the substrate in the third display area, a third light-emitting element disposed on the substrate in the third display area, and a third emission control transistor connected to the second pixel circuit, and the third emission control transistor may connect the second pixel circuit to the third light-emitting element.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1A:
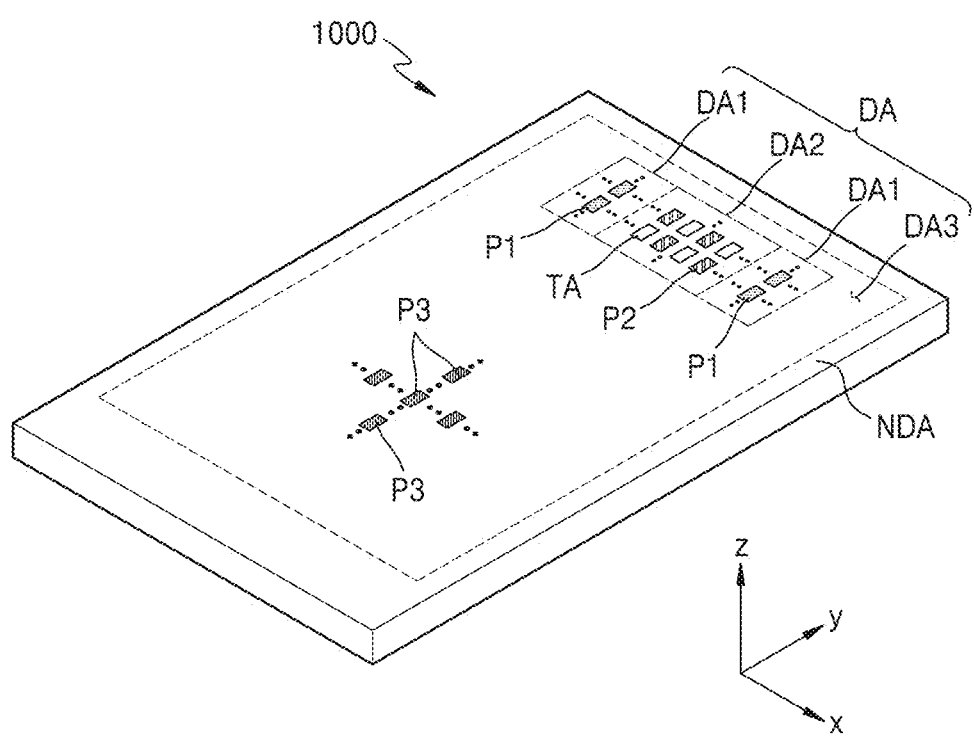
FIGS. 1A and 1B are perspective views of an electronic apparatus including a display device, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

It will be understood that although the terms "first," "second," etc. may be used herein to describe various elements, these elements should not be limited by these terms. These terms are only used to distinguish one element from another. Thus, "a first element," "component," "region," "layer" or "section" discussed below could be termed a second element, component, region, layer or section without departing from the teachings herein.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an."

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that, when a layer, area, or element is referred to as being "on" another layer, area, or element, it may be directly on the other layer, area, or element, or may be indirectly on the other layer, area, or element with intervening layers, areas, or elements therebetween.

Sizes of elements in the drawings may be exaggerated or contracted for convenience of explanation. For example, because sizes and thicknesses of elements in the drawings are arbitrarily illustrated for convenience of explanation, the disclosure is not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

An expression used herein such as "A and/or B" indicates A, B, or A and B. Also, an expression used herein such as "at least one of A and B" indicates A, B, or A and B.

In the following embodiments, the expression "a line extends in a first direction or a second direction" may include a case in which "a line extends in a linear shape" and a case in which "a line extends in a zigzag or curved shape in a first direction or a second direction."

In the following embodiments, when an element is referred to as being "on a plane," it is understood that the element is viewed from the top, and when an element is referred to as being "on a cross-section," it is understood that the element is vertically cut and viewed from the side. In the following embodiments, when elements "overlap" each other, the elements overlap "on a plane" and "a cross-section."

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Embodiments of the invention will hereinafter be described in detail with reference to the accompanying drawings.

Figure 1B:
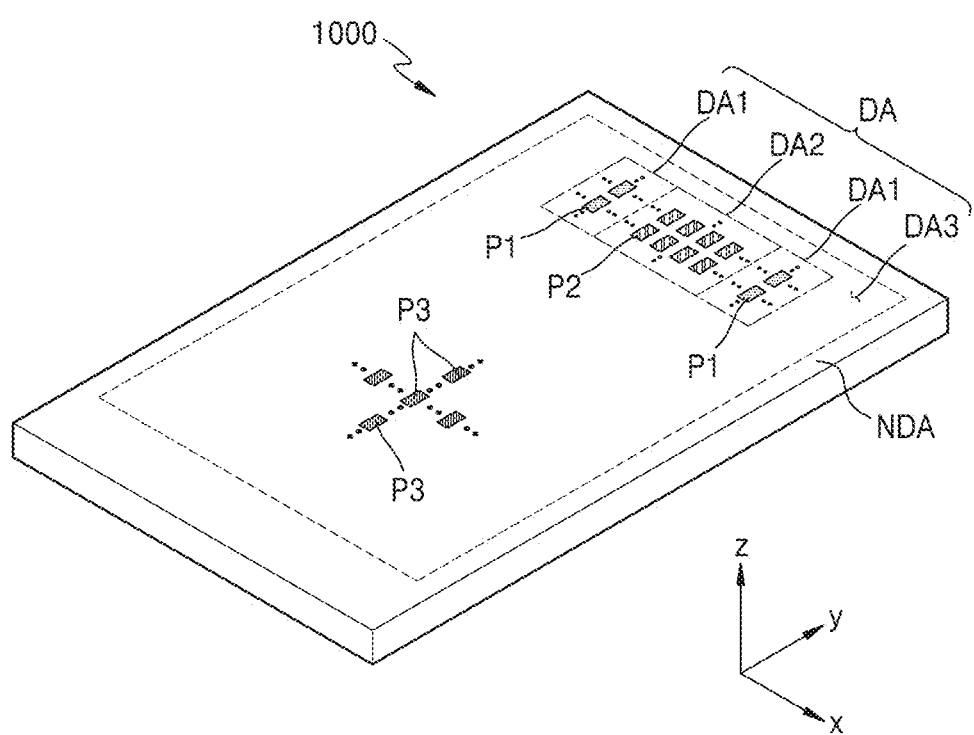

FIGS. 1A and 1B are perspective views of an electronic apparatus 1000 including a display device, according to an embodiment.

Referring to FIG. 1A, an embodiment of the electronic apparatus 1000 may include a display area DA and a non-display area NDA. The non-display area NDA may be positioned outside the display area DA. The electronic apparatus 1000 may display an image through pixels P1, P2, and P3 arranged (or disposed) in a matrix in the display area DA. The pixels P1, P2, and P3 may display a first image by using light emitted from first pixels P1 arranged in a first display area DA1, display a second image by using light emitted from second pixels P2 arranged in a second display area DA2, and display a third image by using light emitted from third pixels P3 arranged in a third display area DA3. In an embodiment, the electronic apparatus 1000 may display an image by combining at least two selected from the first image, the second image, and the third image. Alternatively, the electronic apparatus 1000 may display the first image, the second image, and the third image independently of each other.

Referring to FIG. 1A, the second display area DA2 may include a transmission area TA between the second pixels P2. The transmission area TA is an area through which light may pass, and a pixel may not be arranged in the transmission area TA. Alternatively, referring to FIG. 1B, the second display area DA2 may not include the transmission area TA. In an embodiment where the second display area DA2 does not include the transmission area TA, the number and/or area of pixels that may be arranged in the second display area DA2 increases, and thus, the resolution of the second display area DA2 may be improved.

The non-display area NDA is an area that does not display an image and may entirely surround the display area DA. A driving circuit for providing electrical signals or a power line for supplying power to the first pixels P1, the second pixels P2, and the third pixels P3 may be arranged in the non-display area NDA. Also, a pad, to which an electronic element or a printed circuit board may be electrically connected, may be arranged in the non-display area NDA.

The first display area DA1 may surround at least a portion of the second display area DA2. The second display area DA2 may be an area disposed inwardly from the first display area DA1. In one embodiment, for example, the second display area DA2 may be positioned inside the first display area DA1.

The first display area DA1 may be arranged on at least one side of the second display area DA2. Although FIG. 1A illustrates an embodiment where the first display area DA1 is arranged on opposite sides of the second display area DA2 in a longitudinal direction (e.g., an x-direction of FIG. 1A) of the second display area DA2, one or more embodiments are not limited thereto. Alternatively, the first display area DA1 may be arranged at opposite sides of the second display area DA2 in a y-direction perpendicular to the x-direction or may be arranged to (completely) surround the second display area DA2. Various modifications may be made.

The third display area DA3 may at least partially surround the first display area DA1 and/or the second display area DA2. The third display area DA3 may be an area disposed outwardly from the first display area DA1. In one embodiment, for example, the third display area DA3 may be positioned outside the first display area DA1. The first display area DA1 may be between the second display area DA1 and the third display area DA3.

The first pixels P1 may be arranged in the first display area DA1, and first pixel circuits PC1 for driving the first pixels P1 may be arranged in the first display area DA1 as will be described below. The second pixels P2 may be arranged in the second display area DA2, and pixel circuits for driving the second pixels P2 may be arranged in the first display area DA1 as will be described below. The third pixels P3 may be arranged in the third display area DA3, and second pixel circuits PC2 for driving the third pixels P3 may be arranged in the third display area DA3 as will be described below.

In an embodiment, the second display area DA2 may have a rectangular shape on a plane (or when viewed from a plan view in a thickness direction) as illustrated in FIG. 1A. However, one or more embodiments are not limited thereto. Alternatively, the second display area DA2 may have a circular shape, an elliptical shape, or a polygonal shape such as a bar shape.

The first display area DA1 and the second display area DA2 may be arranged inside the third display area DA3. In an embodiment, the first display area DA1 and the second display area DA2 may be arranged on one side of the third display area DA3, for example, in the y-direction in FIG. 1A.

The first display area DA1 and the second display area DA2 may be entirely surrounded by the third display area DA3 as illustrated in FIG. 1A. In an embodiment, the first display area DA1 and/or the second display area DA2 may be partially surrounded by the third display area DA3. In one embodiment, for example, the first display area DA1 and/or the second display area DA2 may be positioned at one corner portion of the third display area DA3, and in such an embodiment, the first display area DA1 and/or the second display area DA2 may be partially surrounded by the third display area DA3.

The area of the third display area DA3 may be substantially greater than the area of the first display area DA1 and/or the second display area DA2. The third display area DA3 may be referred to as a main display area, and the first display area DA1 and/or the second display area DA2 may be referred to as an auxiliary display area. In an embodiment, as illustrated in FIG. 1A, the electronic apparatus 1000 may include one second display area DA2 or may include two or more second display areas DA2.

Embodiments of the electronic apparatus 1000 may include mobile phones, tablet personal computers ("PC"s), laptop computers, smartwatches or smart bands wearable on a wrist, etc.

Figure 2A:
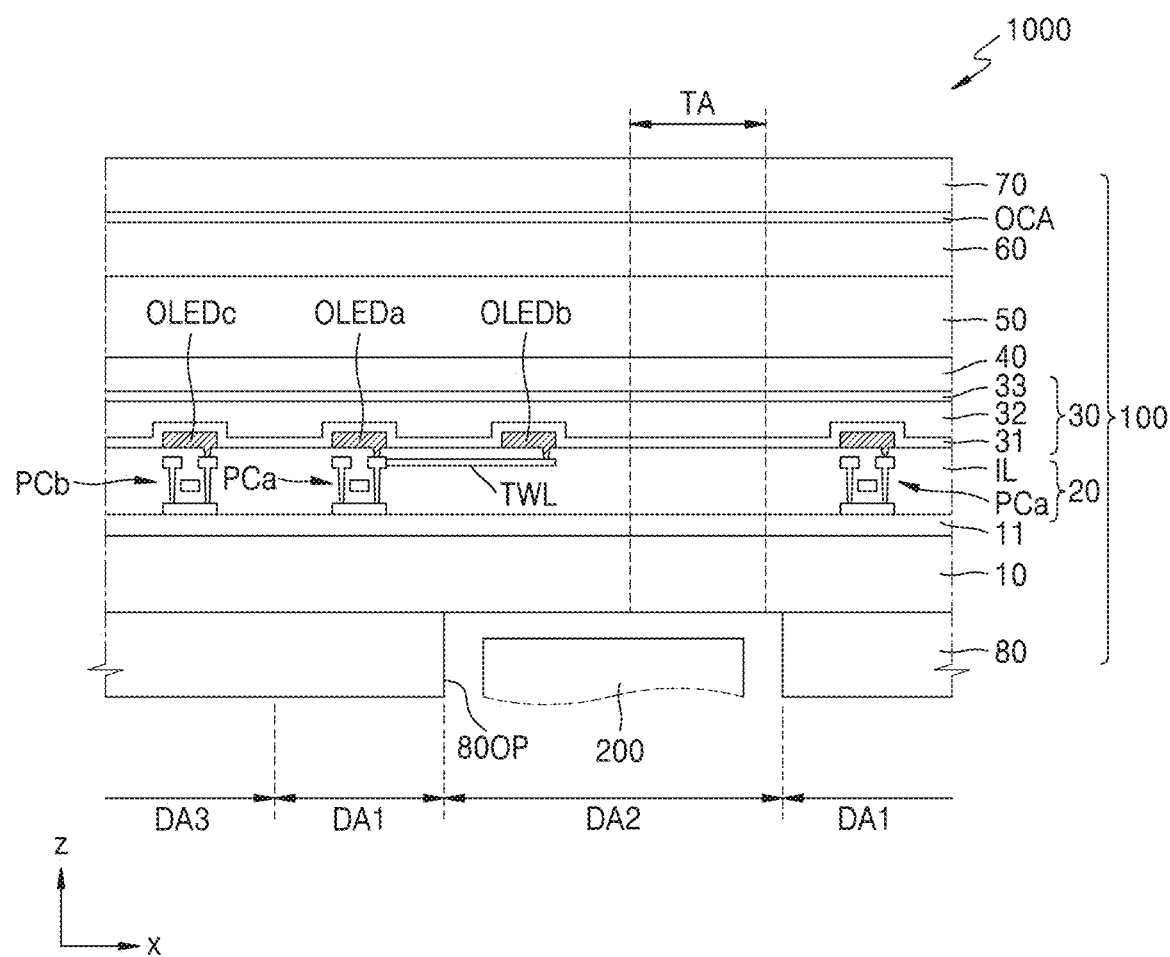
FIGS. 2A and 2B are cross-sectional views of a portion of an electronic device including a display apparatus, according to an embodiment.
Figure 2B:
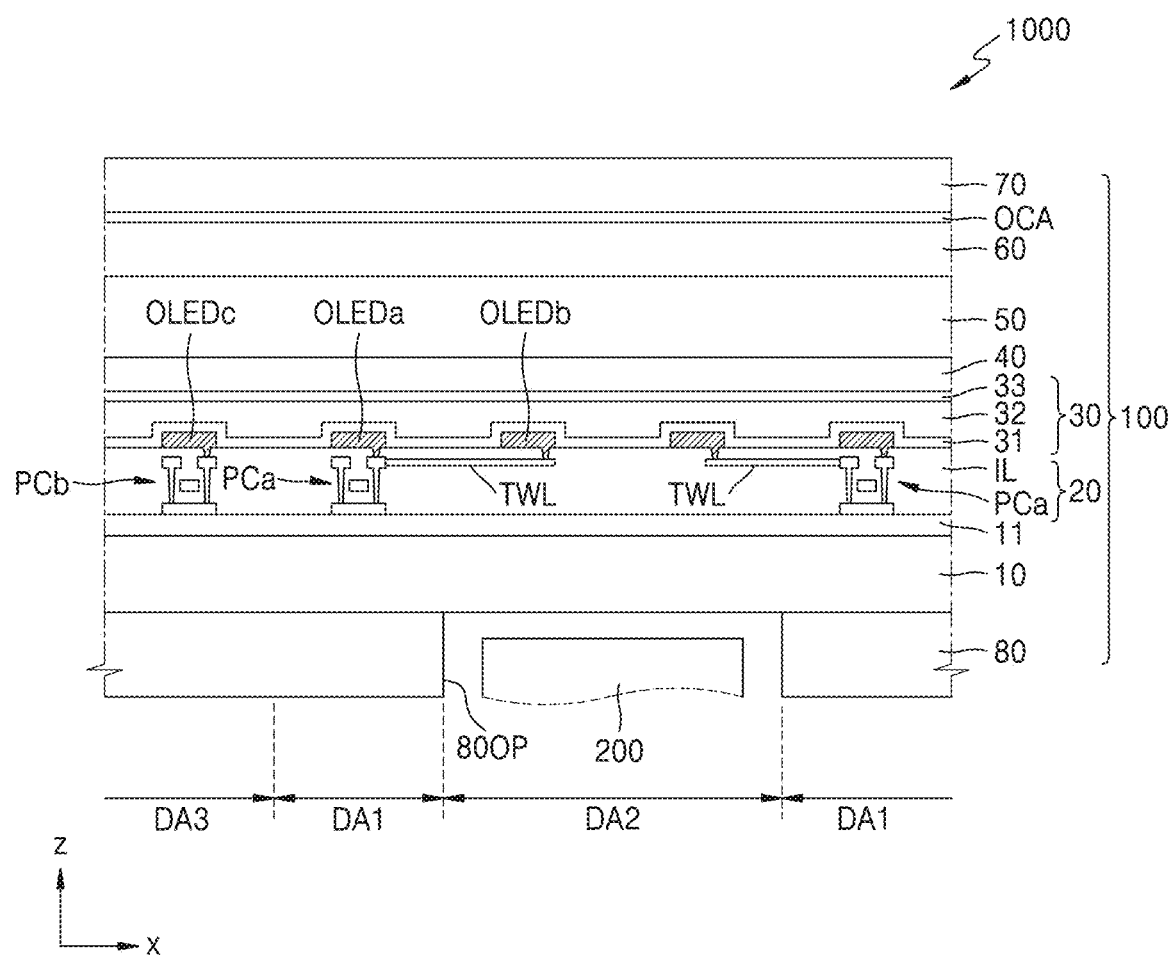

FIGS. 2A and 2B are cross-sectional views of a portion of an electronic apparatus 1000 including a display device 100), according to an embodiment.

Referring to FIG. 2A, an embodiment of the electronic apparatus 1000 may include the display device 100 and a component 200. The component 200 may be arranged to overlap the display device 100.

The display device 100 may include a substrate 10, a display layer 20, a thin-film encapsulation layer 30, an input sensing layer 40, an optical functional layer 50, an anti-reflective layer 60, and a window 70.

The component 200 may be positioned in the second display area DA2. The component 200 may be an electronic element that inputs or outputs light or sound. In one embodiment, for example, the electronic element may be a sensor that measures a distance, such as a proximity sensor, a sensor that recognizes a part of a user's body (e.g., a fingerprint, an iris, a face, etc.), a small lamp that outputs light, an image sensor (e.g., a camera) that captures an image, etc. The electronic element may use light of various wavelength bands, such as visible light, infrared light, or ultraviolet light. The electronic element may use ultrasonic waves or sound of other frequency bands. In an embodiment, the component 200 may include sub-components such as a light-emitting portion and a light-receiving portion. The light-emitting portion and the light-receiving portion may have an integrated structure or a physically separated structure, so that a pair of the light-emitting portion and the light-receiving portion may constitute one component 200.

The substrate 10 may include glass or a polymer resin. In one embodiment, for example, the polymer resin may include a polymer resin such as polyethersulfone, polyacrylate, polyether imide, polyethylene naphthalate, polyethylene terephthalate, polyphenylene sulfide, polyarylate, polyimide, polycarbonate, or cellulose acetate propionate. The substrate 10 including the polymer resin may be flexible, rollable, or bendable. The substrate 10 may have a multi-layer structure including a layer including the polymer resin and an inorganic layer (not shown).

A lower protective film 80 may be arranged on the rear surface of the substrate 10. The lower protective film 80 may be attached to the rear surface of the substrate 10. An adhesive layer may be between the lower protective film 80 and the substrate 10. Alternatively, the lower protective film 80 may be directly formed on the rear surface of the substrate 10.

The lower protective film 80 may support and protect the substrate 10. An opening 800P corresponding to the second display area DA2 may be defined in the lower protective film 80. The opening 800P of the lower protective film 80 may be a concave portion formed by removing a portion of the lower protective film 80 in a thickness direction. In an embodiment, as illustrated in FIG. 2A, the opening 800P of the lower protective film 80 may have a through-hole shape which may be formed by completely removing the portion of the lower protective film 80 in the thickness direction. Alternatively, the opening 800P of the lower protective film 80 may have a blind-hole shape in which one side of the lower protective film 80 is blocked, by partially removing the portion of the lower protective film 80 in the thickness direction.

As the opening 800P is defined or formed in the lower protective film 80, transmittance of the second display area DA2 may be improved. In an embodiment, where the transmission area TA is included in the second display area DA2, light transmittance of the transmission area TA may be improved. The lower protective film 80 may include an organic insulating material such as polyethylene terephthalate or polyimide.

The display layer 20 may be arranged on the front surface of the substrate 10. The display layer 20 may include a plurality of pixels. Each pixel may include a display element or light-emitting element that emits red, green, or blue light. The display element or the light-emitting element may include an organic light-emitting diode.

The display layer 20 may include a display element layer including the organic light-emitting diode that is a display element, a pixel circuit layer including a pixel circuit electrically connected to the organic light-emitting diode, and an insulating layer IL.

A first pixel circuit PCa and a first light-emitting element OLEDa that is electrically connected to the first pixel circuit PCa may be arranged in the first display area DA1. The first light-emitting element OLEDa may at least partially overlap the first pixel circuit PCa.

A second light-emitting element OLEDb may be arranged in the second display area DA2. A pixel circuit for driving the second light-emitting element OLEDb may not be arranged in the second display area DA2. The second light-emitting element OLEDb arranged in the second display area DA2 may be driven through the first pixel circuit PCa arranged in the first display area DA1. In one embodiment, for example, the first pixel circuit PCa arranged in the first display area DA1 and the second light-emitting element OLEDb arranged in the second display area DA2 may be connected to each other via a connection line TWL.

A second pixel circuit PCb and a third light-emitting element OLEDc that is electrically connected to the second pixel circuit PCb may be arranged in the third display area DA3. The third light-emitting element OLEDc may at least partially overlap the second pixel circuit PCb.

In an embodiment, as illustrated in FIG. 2A, the second display area DA2 may include the transmission area TA in which the first pixel circuit PCa and the second light-emitting element OLEDb are not arranged. The transmission area TA is an area through which light emitted from the component 200 and/or light directed to the component 200 may be transmitted. In such an embodiment of the display device 100, transmittance of the transmission area TA may be about 30% or higher, about 40% or higher, about 50% or higher, about 60% or higher, about 70% or higher, about 75% or higher, about 80% or higher, about 85% or higher, or about 90% or higher.

Alternatively, as illustrated in FIG. 2B, the second display area DA2 may not include the transmission area TA. In such an embodiment, as described above, when the second display area DA2 does not include the transmission area TA, the number and/or area of pixels that may be arranged in the second display area DA2 increases, and thus, resolution of the second display area DA2 may be improved.

A buffer layer 11 may be between the substrate 10 and the display layer 20. The buffer layer 11 may reduce or prevent penetration of a foreign material, moisture, or external air from under the substrate 10 and may provide a flat surface on the substrate 10. The buffer layer 11 may include an inorganic material such as oxide or nitride, an organic material, or an organic/inorganic composite material and may have a single-layer structure or a multi-layer structure of an inorganic material and an organic material. In an embodiment, the buffer layer 11 may include silicon oxide $SiO_2$ or silicon nitride SiNx.

The display layer 20 may be sealed with an encapsulation member. In an embodiment, the encapsulation member may include the thin-film encapsulation layer 30 arranged on the display layer 20 as illustrated in FIG. 2A. The thin-film encapsulation layer 30 may include at least one inorganic layer and at least one organic layer. In an embodiment, the thin-film encapsulation layer 30 may include a first inorganic layer 31, a second inorganic layer 33, and an organic layer 32 therebetween.

Alternatively, the encapsulation member may include an encapsulation substrate. The encapsulation substrate may be arranged on the display layer 20, and the display layer 20 may be between the substrate 10 and the encapsulation substrate. A gap may exist between the encapsulation substrate and the display layer 20. The encapsulation substrate may include glass. A sealant may be between the substrate 10 and the encapsulation substrate, and the sealant may be arranged in the non-display area NDA illustrated in FIG. 1A. The sealant may be arranged to surround the display area DA, thereby preventing or minimizing moisture or the like from penetrating into the display area DA through side surfaces of the display device 100.

The input sensing layer 40 may sense an external input, for example, a touch of an object such as a finger or a stylus pen, so that the electronic apparatus 1000 may obtain coordinate information corresponding to a touch position. The input sensing layer 40 may include a touch electrode and trace lines that are connected to the touch electrode. The input sensing layer 40 may sense an external input in a mutual capacitance method or a self-capacitance method.

The input sensing layer 40 may be arranged on the encapsulation member. In an embodiment, the input sensing layer 40 may be directly formed on the thin-film encapsulation layer 30 or the encapsulation substrate. Alternatively, the input sensing layer 40 may be separately formed and then may adhere to the thin-film encapsulation layer 30 or the encapsulation substrate by using adhesive layer such as an optically clear adhesive ("OCA").

The optical functional layer 50 may improve the light efficiency. In one embodiment, for example, front light efficiency and/or side visibility of light emitted from a display element or a light-emitting element may be improved. Also, diffraction of light that passes through the transmission area TA and is directed to the component 200 or is emitted from the component 200 may be minimized or prevented.

The anti-reflective layer 60 may reduce reflectance of light (external light) incident from the outside toward the display device 100. In an embodiment, the anti-reflective layer 60 may include an optical plate such as a retarder and/or a polarizer. The retarder may include a film-type retarder or a liquid crystal coating-type retarder. The retarder may include a λ/2 retarder and/or a λ/4 retarder. The polarizer may include a film-type polarizer or a liquid crystal coating-type polarizer. The film-type polarizer may include a stretchable synthetic resin film, and the liquid crystal coating-type polarizer may include liquid crystals arranged in a certain array.

In an embodiment, the anti-reflective layer 60 may include a filter plate such as a black matrix and/or a color filter. In an embodiment, the anti-reflective layer 60 may include a destructive interference structure. The destructive interference structure may include a first reflective layer and a second reflective layer, which are arranged on different layers from each other. First-reflected light and second-reflected light respectively reflected by the first reflective layer and the second reflective layer may be destructively interfered with each other, and thus, reflectivity of external light may be reduced.

The window 70 may be arranged on the anti-reflective layer 60 and may adhere onto the anti-reflective layer 60 by using an adhesive layer such as an OCA. Although FIG. 2A illustrates an embodiment where the window 70 is arranged on the anti-reflective layer 60, in an alternative embodiment, positions of the anti-reflective layer 60 and the optical functional layer 50 may be interchanged. In such an embodiment, the window 70 may adhere onto the optical functional layer 50 by using an adhesive layer such as an OCA. Alternatively, an OCA under the window 70 may be omitted.

One component 200 or a plurality of components 200 may be arranged in the second display area DA2. in an embodiment where the electronic apparatus 1000 includes a plurality of components 200, the electronic apparatus 1000 may include a plurality of second display areas DA2 corresponding to the number of components 200. In one embodiment, for example, the electronic apparatus 1000 may include a plurality of second display areas DA2 which are apart from each other. Alternatively, a plurality of component 200 may be arranged to correspond to one second display area DA2. In one embodiment, for example, the electronic apparatus 1000 may include a bar-type or rectangular second display area DA2, and the components 200 may be apart from each other in the longitudinal direction (e.g., the x-direction of FIG. 1A) of the second display area DA2. Herein, a z-direction, which is perpendicular to the x-direction and the y-direction, may be a thickness direction of the electronic apparatus 1000.

The display device 100 may include an organic light-emitting diode OLED, as a display element or a light-emitting element. However, one or more embodiments are not limited thereto. In an alternative embodiment, the display device 100 may be a display device such as a light-emitting display (an inorganic light-emitting display or an inorganic electroluminescent ("EL") display) including an inorganic light-emitting element such as a micro light-emitting diode ("LED"), or a quantum dot light-emitting display. In one embodiment, for example, an emission layer of the display element provided in the display device 100 may include an organic material, an inorganic material, quantum dots, an organic material and quantum dots, or an inorganic material and quantum dots.

Figure 3:
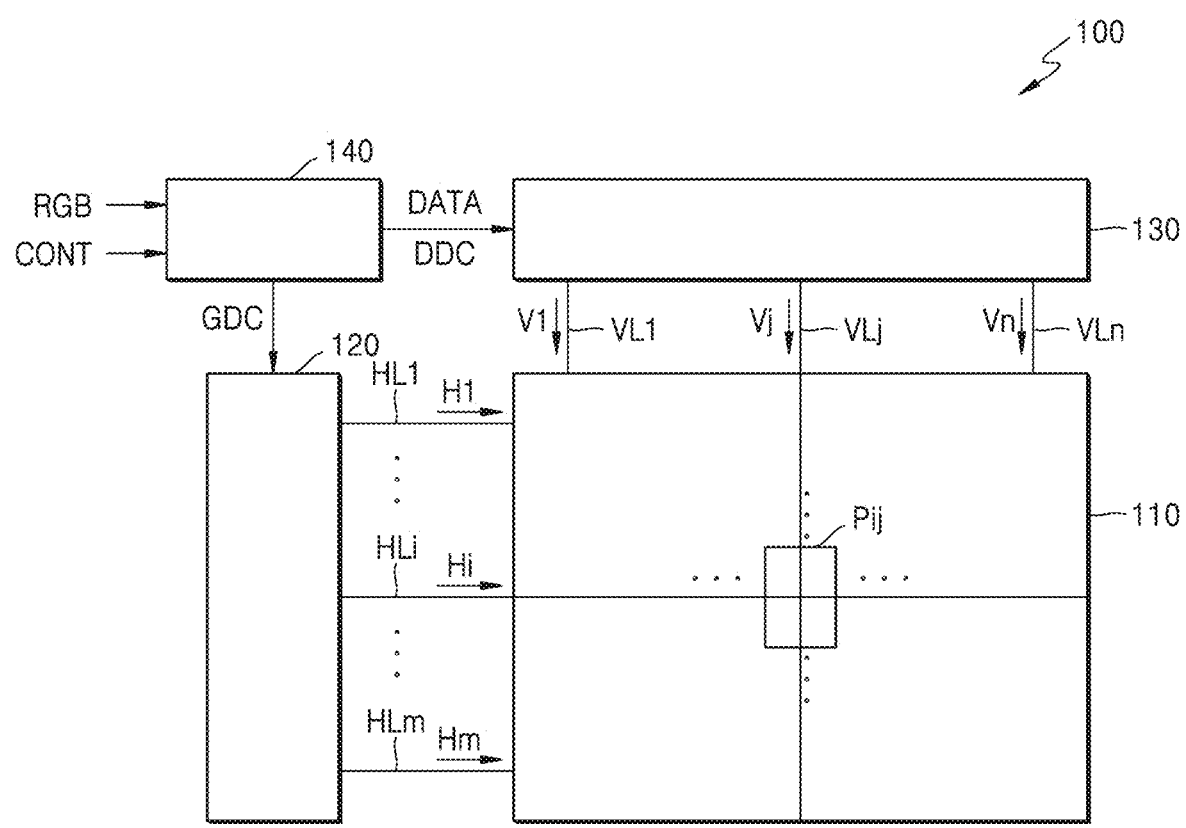
FIG. 3 is a schematic block diagram of a display device according to an embodiment.

FIG. 3 is a schematic block diagram of the display device 100 according to an embodiment.

Referring to FIG. 3, an embodiment of the display device 100 may include a display unit 110, a gate driver 120, a data driver 130, and a timing controller 140.

The display unit 110 may include pixels P such as a pixel Pij positioned in an i-th row and a j-th column, where i is a natural number of 1 to m, and j is a natural number of 1 to n. Although only one pixel Pij is illustrated in FIG. 3 for ease of illustration, the display unit 110 includes first pixels P1 arranged in a matrix form in the first display area DA1 (see FIG. 1), a plurality of second pixels P2 arranged in the second display area DA2, and a plurality of third pixels P3 arranged in the third display area DA3. The first pixels P1, the second pixels P2, and the third pixels P3 may be collectively referred to as the pixels P.

The pixels P may be connected to first signal lines HL1 to HLm and second signal lines VL1 to VLn. Although FIG. 3 illustrates an embodiment where each of the first signal lines HL1 to HLm is provided as a single line, one or more embodiments are not limited thereto. Alternatively, each of the first signal lines HL1 to HLm may be provided as a plurality of lines and may be configured to transmit a plurality of signals to the pixels P. Also, similarly, FIG. 3 illustrates an embodiment where each of the second signal lines VL1 to VLn is provided as a single line, but one or more embodiments are not limited thereto. Alternatively, each of the second signal lines VL1 to VLn may be provided as a plurality of lines and may be configured to transmit a plurality of signals to the pixels P.

Each of the first signal lines HL1 to HLm may include scan lines, emission control lines, and voltage lines, and each of the second signal lines VL1 to VLn may include data lines and power lines. The first signal lines HL1 to HLm may extend in a first direction (e.g., a row direction) and may be connected to pixels P positioned in the same row. The second signal lines VL1 to VLn may extend in a second direction (e.g., a column direction) and may be connected to pixels P positioned in the same column.

Each of the first signal lines HL1 to HLm may be configured to transmit first signals H1 to Hm, which are output from the gate driver 120, to the pixels P in the same row. Each of the first signals H1 to Hm may include scan signals and emission control signals. The scan signals may include first scan signals, second scan signals, and third scan signals. Accordingly, in an embodiment, each of the first signal lines HL1 to HLm may be configured to transmit the first scan signals, the second scan signals, and the third scan signals, which are output from the gate driver 120, to the pixels P in a same row. In such an embodiment, the second scan signal and the third scan signal are transmitted by one signal line and may be a same signal. The emission control signals may include first emission control signals, second emission control signals, and third emission control signals. Accordingly, each of the first signal lines HL1 to HLm may be configured to transmit at least one of the first emission control signals, the second emission control signals, and the third emission control signals, which are output from the gate driver 120, to the pixels P in the same row.

Each of the second signal lines VL1 to VLn may be configured to transmit second signals V1 to Vn, which are output from the data driver 130, to the pixels P in a same row. Each of the second signals V1 to Vn may include a data voltage. Accordingly, each of the first signal lines HL1 to HLm may be configured to transmit a data voltage, output from the data driver 130, to the pixels P in a same row. The pixel Pij may receive a first signal Hi and a second signal Vj.

Though not illustrated, an initialization voltage may be transmitted to the pixels P in the same row through a voltage generator that is separately provided, and a first driving voltage may be transmitted to the pixels P in the same column.

The pixel Pij may include a light-emitting element and a driving transistor that controls an amplitude of a current flowing to the light-emitting element based on the data voltage. The data voltage may be output from the data driver 130 and may be received by the pixel Pij through a second signal line VL. The light-emitting element may be, for example, an organic light-emitting diode. As the light-emitting element emits light with a brightness corresponding to the amplitude of the current received from the driving transistor, the pixel Pij may express a gray level corresponding to the data voltage. Each of the pixels P may correspond to a portion of a unit pixel that may express a full color, for example, a subpixel. The pixel Pij may further include at least one switching transistor and at least one capacitor.

The timing controller 140 may control the display unit 110 by controlling operation timings of the gate driver 120 and the data driver 130. The pixels P of the display unit 110 may receive a new data voltage for each frame period and emit light with a luminance corresponding to the data voltage, thereby displaying an image corresponding to image source data RGB of one frame. In an embodiment, one frame period may include a gate initialization period, a data write and anode initialization period, and an emission period. During the gate initialization period, the initialization voltage may be applied to the pixels P in synchronization with the second scan signal. During the data write and anode initialization period, the data voltage may be provided to the pixels P in synchronization with the first scan signal, and the initialization voltage may be applied to the pixels P in synchronization with the third scan signal. During the emission period, the pixels P of the display unit 110 may emit light.

The timing controller 140 may receive the image source data RGB and a control signal CONT from the outside. The timing controller 140 may convert the image source data RGB into image data DATA based on characteristics of the display unit 110 and the pixels P. The timing controller 140 may provide the image data DATA to the data driver 130.

The control signal CONT may include a vertical synchronization signal ("Vsync"), a horizontal synchronization signal ("Hsync"), a data enable signal ("DE"), a clock signal ("CLK"), and the like. The timing controller 140 may control operating timings of the gate driver 120 and the data driver 130 by using the control signal CONT. The timing controller 140 may determine the frame period by counting the DE during one horizontal scanning period. In an alternative embodiment, the Vsync and the Hsync, which are supplied from the outside, may be omitted. The image source data RGB may include luminance information of the pixels P. The luminance may have a predetermined number of grays, for example, $1024(=2^{10})$ grays, $256(=2^{8})$ grays, or $64(=2^{6})$ grays.

The timing controller 140 may generate control signals including a gate timing control signal GDC for controlling an operation timing of the gate driver 120 and a data timing control signal DDC for controlling an operation timing of the data driver 130.

The gate timing control signal GDC may include a gate start pulse ("GSP"), a gate shift clock ("GSC"), a gate output enable ("GOE") signal, etc. The GSP may be supplied to the gate driver 120 that generates a first scan signal at a start time point of a scanning period. The GSC is a clock signal commonly input to the gate driver 120 and is a clock signal for shifting the GSP. The GOE signal controls an output by the gate driver 120.

The data timing control signal DDC may include a source start pulse ("SSP"), a source sampling clock ("SSC"), a source output enable ("SOE") signal, etc. The SSP may control a data sampling start time point of the data driver 130 and may be provided to the data driver 130 at a start time point of the scanning period. The SSC is a clock signal for controlling a sampling operation of data in the data driver 130 based on a rising or falling edge. The SOE may control an output of the data driver 130. Moreover, the SSP supplied to the data driver 130 may be omitted according to a data transmission method.

The first scan signals, the second scan signals, and the third scan signals may be sequentially generated in response to the gate timing control signal GDC supplied from the timing controller 140, by using first and second gate voltages provided from the voltage generator.

The data driver 130 may sample and latch the image data DATA supplied from the timing controller 140 in response to the data timing control signal DDC supplied from the timing controller 140 and convert the image data DATA into data in a parallel data system. When converting the image data DATA into the data in the parallel data system, the data driver 130 converts the image data DATA into a gamma reference voltage and converts the gamma reference voltage into a data voltage in an analog form. The data driver 130 may provide the data voltage to the pixels P through the data lines. The pixels P may receive the data voltage in response to the first scan signals.

Figure 4:
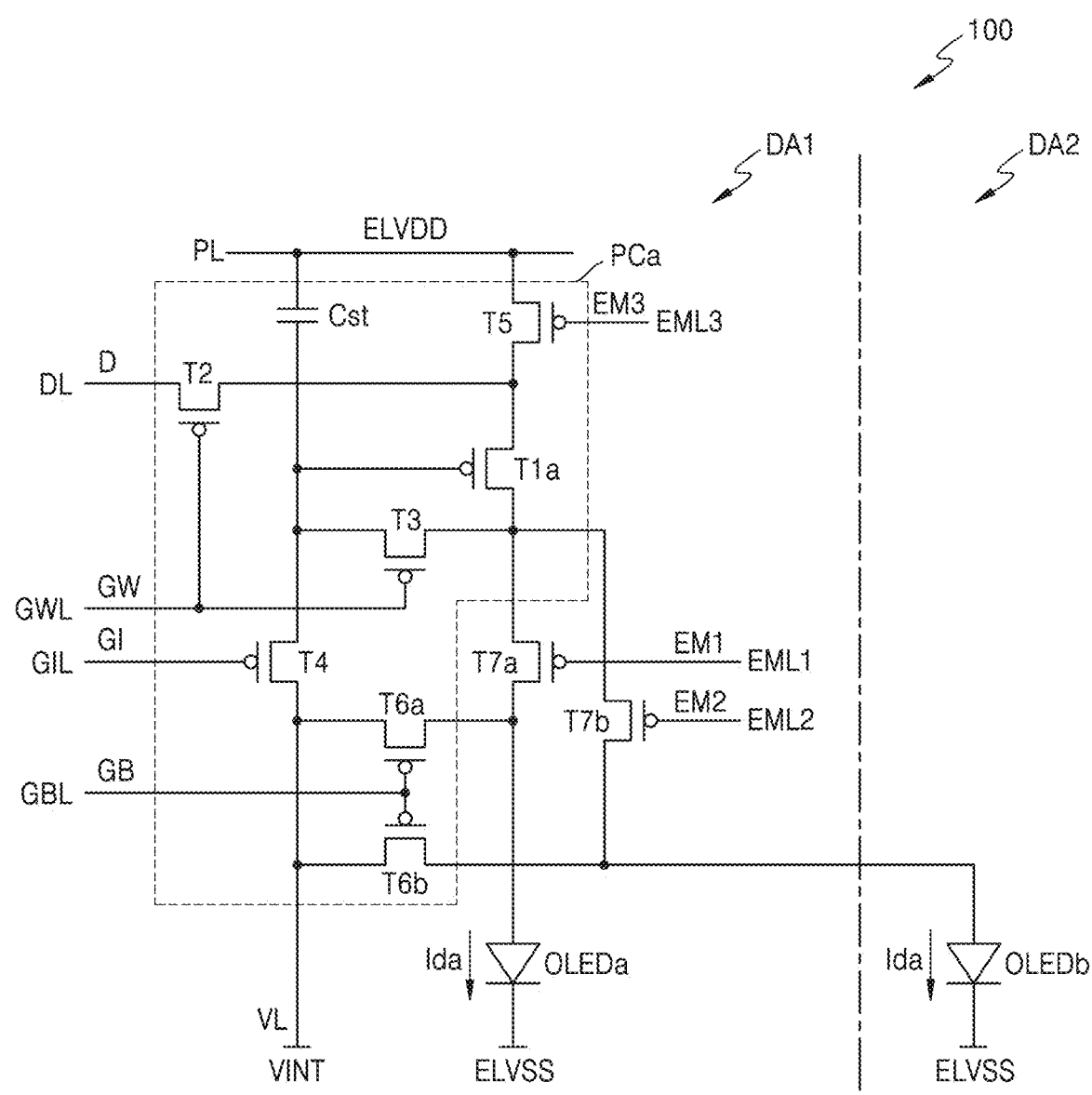
FIG. 4 is a schematic diagram of a pixel circuit included in a display device, according to an embodiment.

FIG. 4 is a schematic diagram of a pixel circuit included in the display device 100, according to an embodiment. In detail, FIG. 4 illustrates a first pixel circuit PCa, a first light-emitting element OLEDa coupled to the first pixel circuit PCa, and a second light-emitting element OLEDb coupled to the first pixel circuit PCa.

Referring to FIG. 4, an embodiment of the display device 100 may include the first pixel circuit PCa, the first light-emitting element OLEDa, and the second light-emitting element OLEDb. Although FIG. 4 illustrates one first pixel circuit PCa, one first light-emitting element OLEDa, and one second light-emitting element OLEDb, for ease of illustration, a plurality of first pixel circuits PCa, a plurality of first light-emitting elements OLEDa, and a plurality of second light-emitting elements OLEDb may be provided in the display device 100. In such an embodiment, the display device 100 may include a first emission control transistor T7a and a second emission control transistor T7b. Although FIG. 4 illustrates one first emission control transistor T7a and one second emission control transistor T7b, for ease of illustration, a plurality of first emission control transistors T7a and a plurality of second emission control transistors T7b may be provided in the display device 100.

The first pixel circuit PCa and the first light-emitting element OLEDa may be arranged in the first display area DA1, and the second light-emitting element OLEDb may be arranged in the second display area DA2. The first pixel circuit PCa may be configured to output a first driving current Ida for driving at least one of (at least one selected from) the first light-emitting element OLEDa and the second light-emitting element OLEDb.

The first emission control transistor T7a may connect the first pixel circuit PCa to the first light-emitting element OLEDa, and the second emission control transistor T7b may connect the first pixel circuit PCa to the second light-emitting element OLEDb.

Although FIG. 4 illustrates an embodiment where the first pixel circuit PCa, the first emission control transistor T7a, and the second emission control transistor T7b are provided as separate elements, one or more embodiments are not limited thereto. In an alternative embodiment, the first emission control transistor T7a and the second emission control transistor T7b may be included in the first pixel circuit PCa.

In an embodiment, the first emission control transistor T7a and the second emission control transistor T7b may be arranged in the first display area DA1. However, one or more embodiments are not limited thereto. In one alternative embodiment, for example, the first emission control transistor T7a may be arranged in the first display area DA1, and the second emission control transistor T7b may be arranged in the second display area DA2.

In an embodiment, the first pixel circuit PCa may include a first driving transistor T1a, a scan transistor T2, a compensation transistor T3, a gate initialization transistor T4, an operation control transistor T5, a first anode initialization transistor T6a, a second anode initialization transistor T6b, and a storage capacitor Cst. However, one or more embodiments are not limited thereto.

In an embodiment, each of the first light-emitting element OLEDa and the second light-emitting element OLEDb may be an organic light-emitting diode including an anode and a cathode. Each cathode may be a common electrode to which a second driving voltage ELVSS is applied.

The first driving transistor T1a may be configured to control an amplitude of the first driving current Ida flowing from a power line PL to the first light-emitting element OLEDa or the second light-emitting element OLEDb in response to a gate voltage. The first driving transistor T1a may include a gate connected to a lower electrode of the storage capacitor Cst and a source connected to the power line PL through the operation control transistor T5. Also, the first driving transistor T1a may be connected to the first light-emitting element OLEDa through the first emission control transistor T7a or may include a drain connected to the second light-emitting element OLEDb through the second emission control transistor T7b.

The first driving transistor T1a may be configured to output the first driving current Ida to the first light-emitting element OLEDa or the second light-emitting element OLEDb. The amplitude of the first driving current Ida may be determined based on the gate voltage of the first driving transistor T1a. In one embodiment, for example, the amplitude of the first driving current Ida may be determined based on a difference between a gate-source voltage of the first driving transistor T1a and a threshold voltage of the first driving transistor T1a. The gate-source voltage of the first driving transistor T1a corresponds to a difference between the gate voltage and a source voltage. Each of the first light-emitting element OLEDa and the second light-emitting element OLEDb may receive the first driving current Ida from the first driving transistor T1a and emit light with a brightness according to the amplitude of the first driving current Ida.

The scan transistor T2 may be configured to receive a data voltage D in response to a first scan signal GW. The scan transistor T2 may be configured to transmit the data voltage D to the source of the first driving transistor T1a in response to the first scan signal GW. The scan transistor T2 may include a gate connected to a first scan line GWL, a source connected to a data line DL, and a drain connected to the source of the first driving transistor T1a.

The storage capacitor Cst may be connected between the power line PL and the first driving transistor T1a. The storage capacitor Cst may include an upper electrode connected to the power line PL and a lower electrode connected to the gate of the first driving transistor T1a. The storage capacitor Cst may store a voltage corresponding to a difference between a first driving voltage ELVDD applied to the power line PL and the gate voltage of the first driving transistor T1a and may maintain the gate voltage of the first driving transistor T1a.

The compensation transistor T3 may be connected between the drain and the gate of the first driving transistor T1a and may connect the drain and the gate of the first driving transistor T1a to each other in response to the first scan signal GW. The compensation transistor T3 may include a gate connected to the first scan line GWL, a source connected to the drain of the first driving transistor T1a, and a drain connected to the gate of the first driving transistor T1a. The compensation transistor T3 may include a plurality of transistors which are connected in series and are simultaneously controlled by the first scan signal GW.

When the compensation transistor T3 is turned on in response to the first scan signal GW, the drain and gate of the first driving transistor T1a are connected to each other so that the first driving transistor T1a may be diode-connected. The data voltage D may be received from the source of the first driving transistor T1a through the scan transistor T2 in response to the first scan signal GW, and the data voltage D may be transmitted to the gate of the first driving transistor T1a through the diode-connected first driving transistor T1a. When the gate voltage of the first driving transistor T1a is equal to a voltage obtained by subtracting the threshold voltage of the first driving transistor T1a from the data voltage D, the first driving transistor T1a may be turned off, and the gate voltage of the first driving transistor T1a, which is equal to the voltage obtained by subtracting the threshold voltage of the first driving transistor T1a from the data voltage D, may be stored in the storage capacitor Cst.

The gate initialization transistor T4 may be configured to apply an initialization voltage VINT to the gate of the first driving transistor T1a in response to a second scan signal GI. The gate initialization transistor T4 may include a gate connected to a second signal line GIL, a source connected to the gate of the first driving transistor T1a, and a drain connected to a voltage line VL.

The first anode initialization transistor T6a may be configured to apply the initialization voltage VINT to the anode of the first light-emitting element OLEDa in response to a third scan signal GB. The first anode initialization transistor T6a may include a gate connected to a third signal line GBL, a source connected to the anode of the first light-emitting element OLEDa, and a drain connected to the voltage line VL.

Also, the second anode initialization transistor T6b may be configured to apply the initialization voltage VINT to the anode of the second light-emitting element OLEDb in response to the third scan signal GB. The second anode initialization transistor T6b may include a gate connected to the third signal line GBL, a source connected to the anode of the second light-emitting element OLEDb, and a drain connected to the voltage line VL.

Although FIG. 4 illustrates an embodiment where two anode initialization transistors are provided in one pixel circuit, one or more embodiments are not limited thereto. In one alternative embodiment, for example, a single anode initialization transistor may be provided in one pixel circuit.

The operation control transistor T5 may connect the power line PL to the source of the first driving transistor T1a in response to a third emission control signal EM3. The operation control transistor T5 may include a gate connected to a third emission control line EML3, a source connected to the power line PL, and a drain connected to the source of the first driving transistor T1a.

The first emission control transistor T7a may connect the drain of the first driving transistor T1a to the anode of the first light-emitting element OLEDa in response to a first emission control signal EM1. The first emission control transistor T7a may be configured to transmit the first driving current Ida output by the first driving transistor T1a to the anode of the first light-emitting element OLEDa. The first emission control transistor T7a may include a gate connected to a first emission control line EML1, a source connected to the drain of the first driving transistor T1a, and a drain connected to the anode of the first light-emitting element OLEDa.

The second emission control transistor T7b may connect the drain of the first driving transistor T1a to the anode of the second light-emitting element OLEDb in response to a second emission control signal EM2. The second emission control transistor T7b may be configured to transmit the first driving current Ida output by the first driving transistor T1a to the anode of the second light-emitting element OLEDb. The second emission control transistor T7b may include a gate connected to a second emission control line EML2, a source connected to the drain of the first driving transistor T1a, and a drain connected to the anode of the second light-emitting element OLEDb.

In an embodiment, the third emission control signal EM3 transmitted through the third emission control line EML3 may be synchronized with at least one of (or at least one selected from) the first emission control signal EM1 transmitted through the first emission control line EML1 and the second emission control signal EM2 transmitted through the second emission control line EML2.

Figure 5:
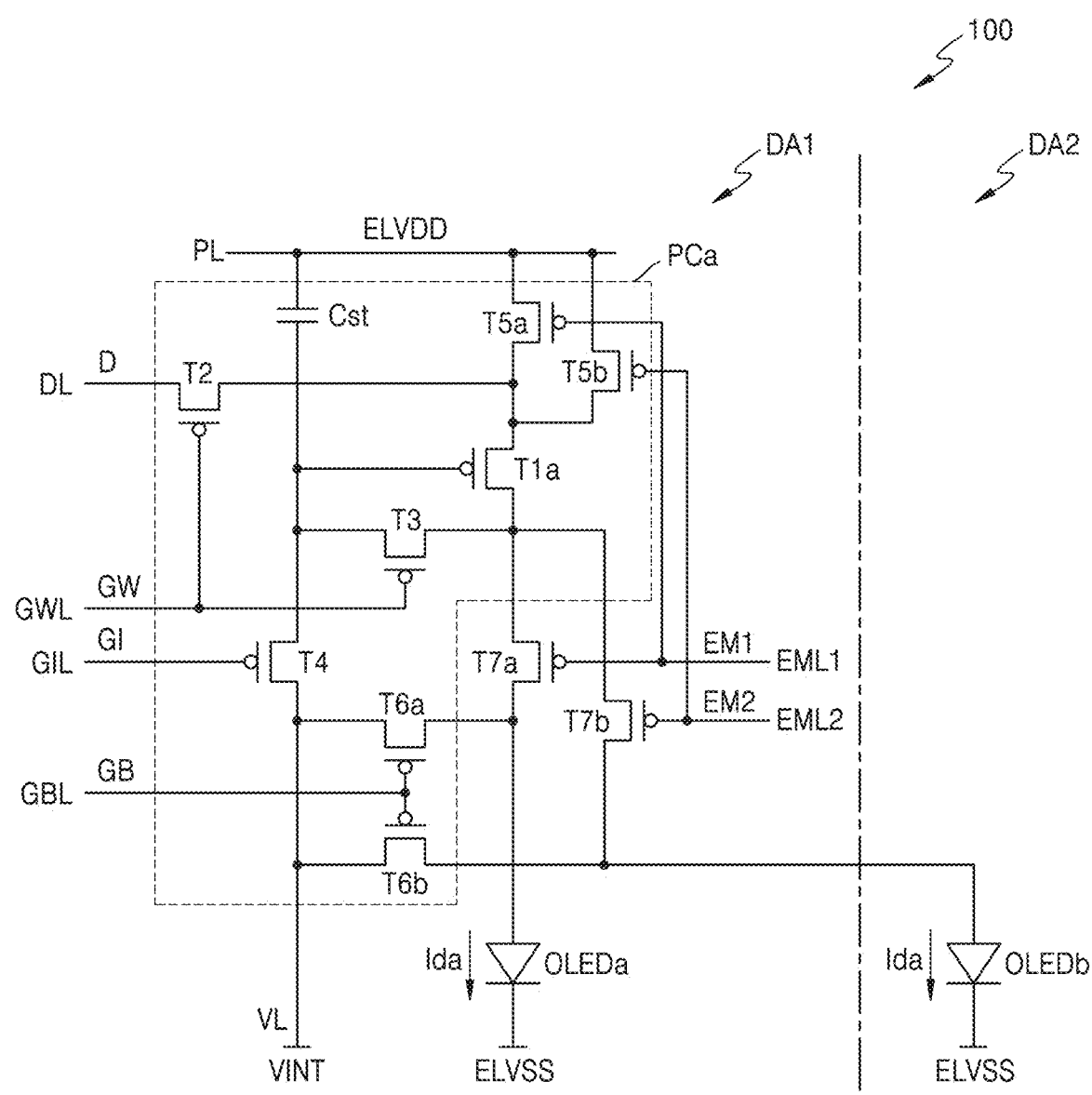
FIG. 5 is a schematic diagram of a pixel circuit included in a display device, according to an embodiment.

FIG. 5 is a schematic diagram of a pixel circuit included in the display device 100, according to an embodiment. The embodiment of FIG. 5 is substantially the same as the embodiment of FIG. 4 except that two operation control transistors T5 are provided. In FIG. 5, like reference numerals as those of FIG. 4 denote like elements, and thus, any repetitive detailed descriptions thereof will be omitted.

Referring to FIG. 5, an embodiment of the display device 100 may include a first pixel circuit PCa, a first light-emitting element OLEDa, and a second light-emitting element OLEDb. In such an embodiment, the display device 100 may include a first emission control transistor T7a and a second emission control transistor T7b.

The first pixel circuit PCa may include a first driving transistor T1a, a scan transistor T2, a compensation transistor T3, a gate initialization transistor T4, a first operation control transistor T5a, a second operation control transistor T5b, a first anode initialization transistor T6a, a second anode initialization transistor T6b, and a storage capacitor Cst. However, one or more embodiments are not limited thereto.

The first driving transistor T1a may be configured to control an amplitude of a first driving current Ida flowing from a power line PL to the first light-emitting element OLEDa or the second light-emitting element OLEDb according to a gate voltage. The first driving transistor T1a may include a gate connected to a lower electrode of the storage capacitor Cst and a source connected to the power line PL through the first operation control transistor T5a or the second operation control transistor T5b. Also, the first driving transistor T1a may be connected to the first light-emitting element OLEDa through the first emission control transistor T7a or may include a drain connected to the second light-emitting element OLEDb through the second emission control transistor T7b.

The first operation control transistor T5a may connect the power line PL to the source of the first driving transistor T1a in response to a first emission control signal EM1. The first operation control transistor T5a may include a gate connected to the first emission control line EML1, a source connected to the power line PL, and a drain connected to the source of the first driving transistor T1a.

The second operation control transistor T5b may connect the power line PL to the source of the first driving transistor T1a in response to a second emission control signal EM2.

The second operation control transistor T5*b* may include a gate connected to the second emission control line EML2, a source connected to the power line PL, and a drain connected to the source of the first driving transistor T1*a*.

In such an embodiment, the first operation control transistor T5*a* may operate in response to a same signal as the first emission control transistor T7*a*, and the second operation control transistor T5*b* may operate in response to a same signal as the second emission control transistor T7*b*. In one embodiment, for example, the first operation control transistor T5*a* and the first emission control transistor T7*a* may operate through the first emission control signal EM1 applied through the first emission control line EML1, and the second operation control transistor T5*b* and the second emission control transistor T7*b* may operate through the second emission control signal EM2 applied through the second emission control line EML2.

Figure 6:
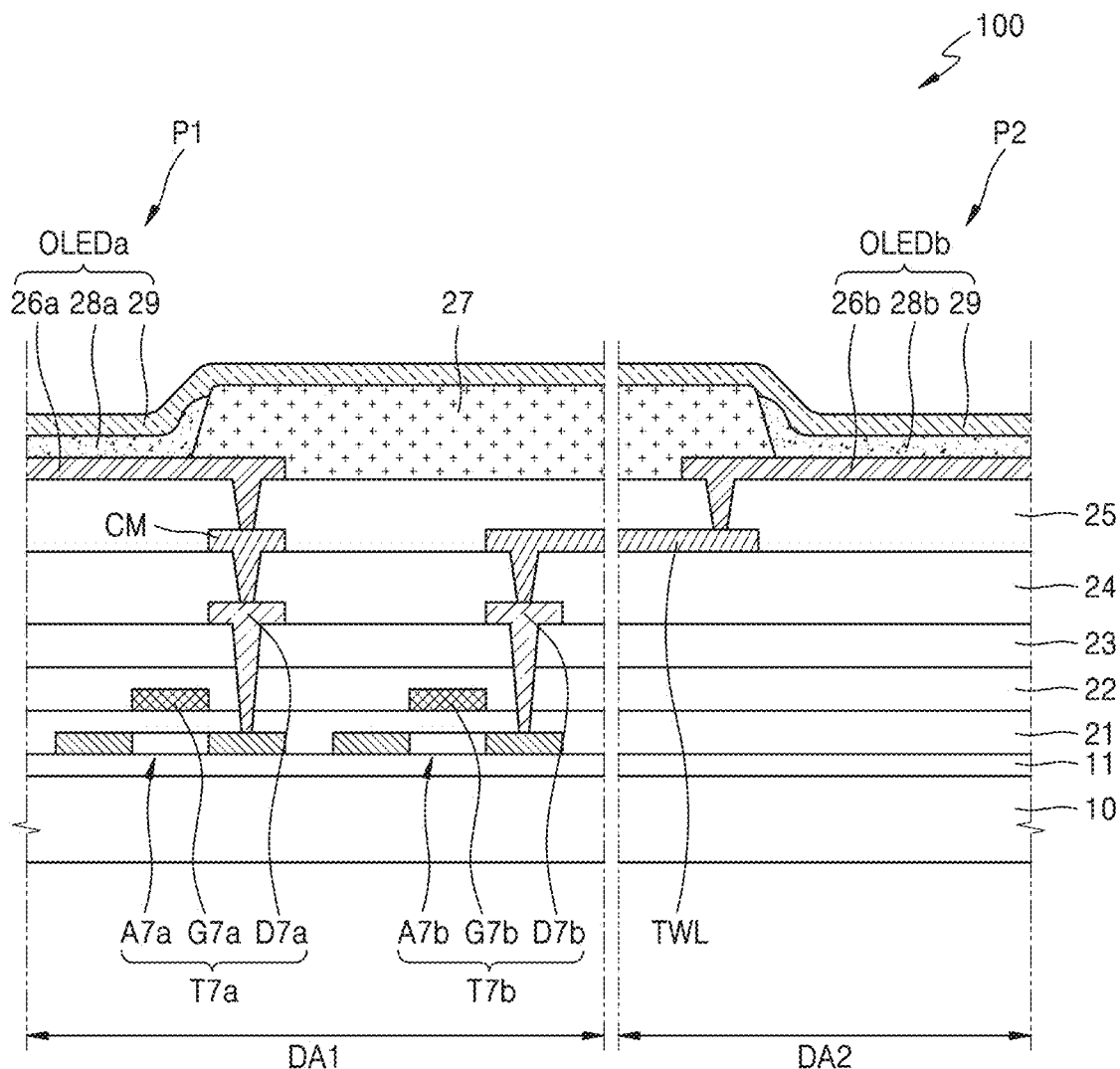
FIG. 6 is a schematic cross-sectional view of a display device according to an embodiment.

FIG. 6 is a schematic cross-sectional view of the display device 100 according to an embodiment.

Referring to FIGS. 4 and 6, an embodiment of the display device 100 may include a first emission control transistor T7*a* and a second emission control transistor T7*b* and may include a first light-emitting element OLEDa and a second light-emitting element OLEDb.

In an embodiment, the first emission control transistor T7*a*, the second emission control transistor T7*b*, and the first light-emitting element OLEDa may be arranged in the first display area DA1, and the second light-emitting element OLEDb may be arranged in the second display area DA2. However, one or more embodiments are not limited thereto. Alternatively, the second emission control transistor T7*b* may be arranged in the second display area DA2.

In an embodiment, where the second emission control transistor T7*b* is arranged in the second display area DA2, the second emission control transistor T7*b* may be arranged to overlap the second light-emitting element OLEDb. In an embodiment, where the second emission control transistor T7*b* is arranged in the second display area DA2, the second emission control line EML2 applied to the second emission control transistor T7*b* may include a transparent conducting oxide ("TCO"). The second emission control line EML2 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO").

The substrate 10 may include glass or a polymer resin as described above. The buffer layer 11 may be arranged on the substrate 10. The buffer layer 11 may reduce or prevent penetration of a foreign material, moisture, or external air from under the substrate 10 and may provide a flat surface on the substrate 10.

A first semiconductor layer A7*a* of the first emission control transistor T7*a* and a second semiconductor layer A7*b* of the second emission control transistor T7*b* may be arranged on the buffer layer 11. In an embodiment, the first semiconductor layer A7*a* and the second semiconductor layer A7*b* may include polysilicon or amorphous silicon. Alternatively, the first semiconductor layer A7*a* and the second semiconductor layer A7*b* may include an oxide of at least one material selected from indium (In), gallium (Ga), tin (Sn), zirconium (Zr), hafnium (Hf), titanium (Ti), and zinc (Zn). In an embodiment, the first semiconductor layer A7*a* and the second semiconductor layer A7*b* may include an In—Ga—Zn—O (IGZO) semiconductor in which a metal such as In and Ga is included in ZnO. The first semiconductor layer A7*a* and the second semiconductor layer A7*b* may include a channel, and a source and a drain arranged at both sides of the channel, respectively.

A first insulating layer 21 may be arranged on the first semiconductor layer A7*a* and the second semiconductor layer A7*b*. The first insulating layer 21 may include silicon oxide ($SiO_2$), silicon nitride (SiNx), silicon oxynitride (SiON), aluminum oxide ($Al_2O_3$), titanium oxide ($TiO_2$), etc. The first insulating layer 21 may be defined by a single layer or multiple layers including the aforedescribed inorganic insulating material.

A first gate electrode G7*a* of the first emission control transistor T7*a* and a second gate electrode G7*b* of the second emission control transistor T7*b* may be arranged on the first insulating layer 21. Each of the first gate electrode G7*a* and the second gate electrode G7*b* may include molybdenum (Mo), aluminum (Al), copper (Cu), Ti, and the like and may be defined by a single layer or multiple layers. In one embodiment, for example, each of the first gate electrode G7*a* and the second gate electrode G7*b* may include a single Mo layer.

A second insulating layer 22 may be arranged on the first gate electrode G7*a* and the second gate electrode G7*b*. The second insulating layer 22 may include $SiO_2$, SiNx, SiON, $Al_2O_3$, $TiO_2$, etc. The second insulating layer 22 may be defined by a single layer or multiple layers including the aforedescribed inorganic insulating material.

A third insulating layer 23 may be arranged on the second insulating layer 22. The third insulating layer 23 may include $SiO_2$, SiNx, SiON, $Al_2O_3$, $TiO_2$, etc. The third insulating layer 23 may be defined by a single layer or multiple layers including the aforedescribed inorganic insulating material.

A first drain electrode D7*a* of the first emission control transistor T7*a* and a second drain electrode D7*b* of the second emission control transistor T7*b* may be arranged on the third insulating layer 23. The first drain electrode D7*a* and the second drain electrode D7*b* may include a material having high conductivity, such as a metal, a conductive oxide, or the like. The first drain electrode D7*a* and the second drain electrode D7*b* may be defined by a single layer or multiple layers including Al, Cu, Ti, and the like. In one embodiment, for example, each of the first drain electrode D7*a* and the second drain electrode D7*b* may be provided as or defined by a triple layer of titanium, aluminum, and titanium (Ti/Al/Ti) that are sequentially arranged.

A first planarization layer 24 may be arranged on the first drain electrode D7*a* and the second drain electrode D7*b*. The first planarization layer 24 may include a general-purpose polymer such as photosensitive polyimide, polyimide, polystyrene ("PS"), polycarbonate ("PC"), benzocyclobutene ("BCB"), hexamethyldisiloxane ("HMDSO"), or polymethylmethacrylate ("PMMA"), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer.

Alternatively, the first planarization layer 24 may include a siloxane-based organic material. The siloxane-based organic material may include hexamethyldisiloxane, octamethyltrisiloxane, decamethyltetrasiloxane, dodecamethylpentasiloxane, and polydimethylsiloxane.

A contact electrode CM and a connection line TWL may be arranged on the first planarization layer 24, and a second planarization layer 25 may be arranged on the contact electrode CM and the connection line TWL. In an embodiment, the second planarization layer 25 may include a same material as the first planarization layer 24. Alternatively, the second planarization layer 25 may include a material different from that of the first planarization layer 24.

The first light-emitting element OLEDa and the second light-emitting element OLEDb may be arranged on the second planarization layer 25. The first light-emitting element OLEDa may include a first anode 26a, a first intermediate layer 28a, and a cathode 29, and the first light-emitting element OLEDa may include a second anode 26b, a second intermediate layer 28b, and a cathode 29.

In an embodiment, the first anode 26a and the second anode 26b may each include a conductive oxide such as ITO, IZO, ZnO, $In_2O_3$, IGO, or AZO. Alternatively, the first anode 26a and the second anode 26b may each include a reflective layer including silver (Ag), magnesium (Mg), Al, or a compound thereof. In one embodiment, for example, the first anode 26a and the second anode 26b may each have a stacked structure of ITO/Ag/ITO.

A pixel-defining layer 27 may be arranged on the second planarization layer 25. The pixel-defining layer 27 may cover edges of the first anode 26a and the second anode 26b and an opening, through which central portions of the first anode 26a and the second anode 26b are exposed, may be defined through the pixel-defining layer 27, thereby defining a pixel. Also, the pixel-defining layer 27 may prevent an arc or the like from occurring at the edges of the first anode 26a and the second anode 26b by increasing a distance between the edges of the first anode 26a and the second anode 26b and the cathodes 29 above the first anode 26a and the second anode 26b.

The first intermediate layer 28a and the second intermediate layer 28b may include a low molecular weight material or a polymer material and may emit red, green, blue, or white light. In an embodiment where the first intermediate layer 28a and the second intermediate layer 28b include a low molecular weight material, the first intermediate layer 28a and the second intermediate layer 28b may have a structure in which a hole injection layer ("HIL"), a hole transport layer ("HTL"), an emission layer ("EML"), an electron transport layer ("ETL"), an electron injection layer ("EIL"), and the like are stacked in a single or composite structure, and may include various organic materials, such as copper phthalocyanine ("CuPc"), N,N-di(naphthalene-1-yl)-N,N'-diphenyl-benzidine (N,N-Di(naphthalene-1-yl)-N,N'-diphenyl-benzidine ("NPB"), tris-8-hydroxyquinoline aluminum ("Alq3"), and the like. Such layers may be formed by a vacuum deposition.

In an embodiment where the first intermediate layer 28a and the second intermediate layer 28b include a polymer material, the first intermediate layer 28a and the second intermediate layer 28b may have a structure including an HTL and an EML. In such an embodiment, the HTL may include PEDOT, and the EML may include a polymer material such as poly-phenylvinylene ("PPV")-based material and polyfluorene-based material. The first intermediate layer 28a and the second intermediate layer 28b may be formed by screen printing, inkjet printing, or laser induced thermal image ("LITI").

The first intermediate layer 28a and the second intermediate layer 28b are not limited thereto, but may have various structures. In addition, the first intermediate layer 28a and the second intermediate layer 28b may include a layer integrated across the anodes 26a and 26b or may include a layer patterned to correspond to each of the anodes 26a and 26b.

The cathodes 29 may be arranged on the first intermediate layer 28a and the second intermediate layer 28b, respectively. The cathode 29 may include a conductive material having a low work function. In one embodiment, for example, the cathode 29 may include a (semi-)transparent layer including Ag, Mg, Al, platinum (Pt), lithium (Li), calcium (Ca), or an alloy thereof. Alternatively, the cathode 29 may further include a layer such as ITO, IZO, ZnO, or $In_2O_3$ on the (semi-)transparent layer including the aforedescribed material. The cathode 29 may be integrally formed as a single body for a plurality of organic light-emitting diodes.

In an embodiment, the first drain electrode D7a may be electrically connected to a drain of the first emission control transistor T7a through a contact hole defined through the first insulating layer 21, the second insulating layer 22, and the third insulating layer 23. In such an embodiment, the contact electrode CM may be electrically connected to the first drain electrode D7a of the first emission control transistor T7a through a contact hole defined in the first planarization layer 24. The first anode 26a of the first light-emitting element OLEDa may be electrically connected to the contact electrode CM through a via hole defined in the second planarization layer 25. Accordingly, the drain of the first emission control transistor T7a may be electrically connected to the first anode 26a of the first light-emitting element OLEDa. Therefore, the first light-emitting element OLEDa may emit light with a brightness corresponding to an amplitude of the first driving current Ida.

In an embodiment, the second drain electrode D7b may be electrically connected to a drain of the second emission control transistor T7b through a contact hole defined through the first insulating layer 21, the second insulating layer 22, and the third insulating layer 23. In such an embodiment, the connection line TWL may be electrically connected to the second drain electrode D7b of the second emission control transistor T7b through a contact hole defined in the first planarization layer 24. The second anode 26b of the second light-emitting element OLEDb may be electrically connected to the connection line TWL through a via hole defined in the second planarization layer 25. Accordingly, the drain of the second emission control transistor T7b may be electrically connected to the second anode 26b of the second light-emitting element OLEDb. Therefore, the second light-emitting element OLEDb may emit light with a brightness corresponding to the amplitude of the first driving current Ida.

In an embodiment, the connection line TWL may be arranged in the first display area DA1 and the second display area DA2. In one embodiment, for example, the connection line TWL may be arranged in the first display area DA1, and at least a portion of the connection line TWL may extend to the second display area DA2. The second emission control transistor T7b arranged in the first display area DA1 may be electrically connected to the second light-emitting element OLEDb arranged in the second display area DA2 through the connection line TWL.

In an embodiment, the connection line TWL may include a TCO. The connection line TWL may include a conductive oxide such as ITO, IZO, ZnO, $In_2O_3$, IGO, or AZO.

Although FIG. 6 illustrates an embodiment where the connection line TWL is arranged on the first planarization layer 24, one or more embodiments are not limited thereto. Alternatively, the connection line TWL may be arranged on one of the buffer layer 11, the first insulating layer 21, the second insulating layer 22, and the third insulating layer 23.

Figure 7:
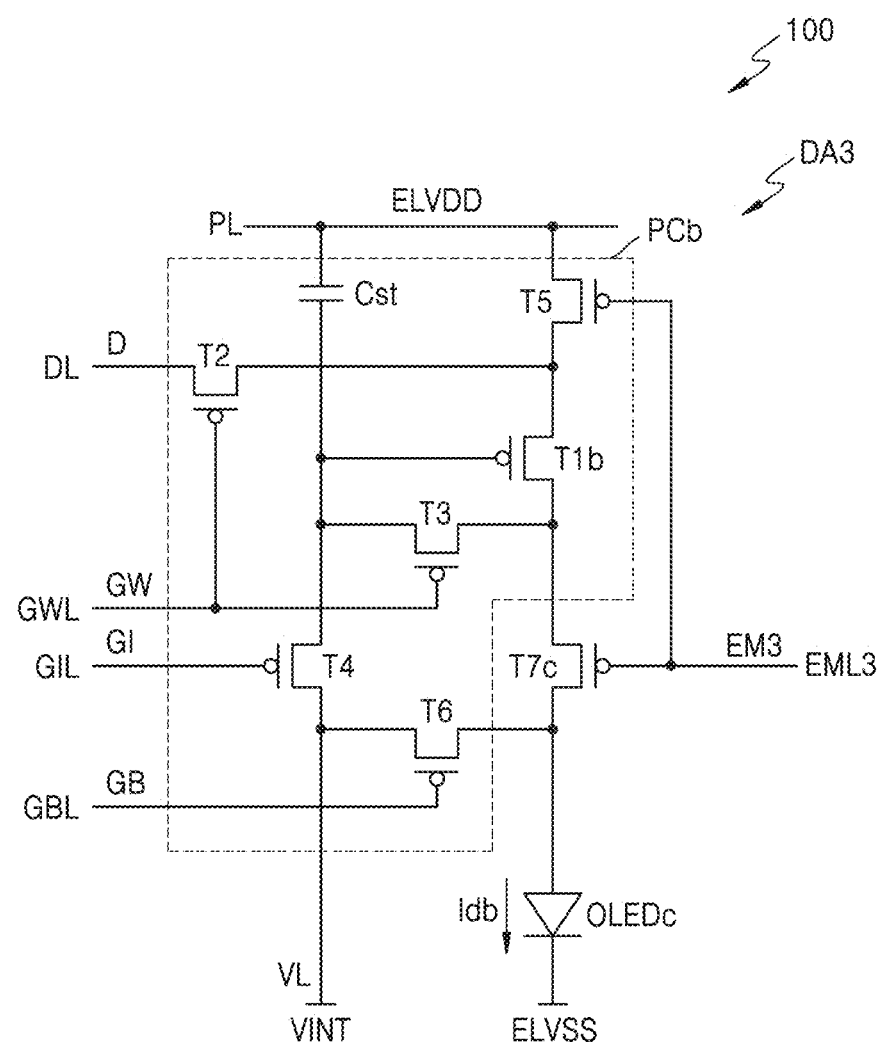
FIG. 7 is a schematic diagram of a pixel circuit included in a display device, according to an embodiment.

FIG. 7 is a schematic diagram of a pixel circuit included in the display device 100, according to an embodiment. In detail, FIG. 7 illustrates a second pixel circuit PCb and a third light-emitting element OLEDc that is connected to the second pixel circuit PCb.

Referring to FIG. 7, an embodiment of the display device 100 may include the second pixel circuit PCb and the third light-emitting element OLEDc. Although FIG. 7 illustrates one second pixel circuit PCb and one third light-emitting element OLEDc for ease of illustration, a plurality of second pixel circuits PCb and a plurality of third light-emitting elements OLEDc may be provided in the display device 100. Also, the display device 100 may include a third emission control transistor T7c. Although FIG. 7 illustrates one third emission control transistor T7c for ease of illustration, a plurality of third emission control transistors T7c may be provided in the display device 100.

The second pixel circuit PCb and the third light-emitting element OLEDc may be arranged in the third display area DA3. The second pixel circuit PCb may be configured to output a second driving current Idb for driving the third light-emitting element OLEDc. The third emission control transistor T7c may connect the second pixel circuit PCb to the third light-emitting element OLEDc.

Although FIG. 7 illustrates one embodiment where the second pixel circuit PCb and the third emission control transistor T7c are provided as separate elements, one or more embodiments are not limited thereto. Alternatively, the third emission control transistor T7c may be included in the second pixel circuit PCb.

In an embodiment, the second pixel circuit PCb may include a second driving transistor T1b, a scan transistor T2, a compensation transistor T3, a gate initialization transistor T4, an operation control transistor T5, an anode initialization transistor T6, and a storage capacitor Cst. However, one or more embodiments are not limited thereto. The third light-emitting element OLEDc may be an organic light-emitting diode including an anode and a cathode.

The second driving transistor T1b may be configured to control an amplitude of the second driving current Idb flowing from a power line PL to the third light-emitting element OLEDc based on a gate voltage. The second driving transistor T1b may include a gate connected to a lower electrode of the storage capacitor Cst and a source connected to the power line PL through the operation control transistor T5. Also, the second driving transistor T1b may include a drain connected to the third light-emitting element OLEDc through the third emission control transistor T7c.

The second driving transistor T1b may be configured to output the second driving current Idb to the third light-emitting element OLEDc. The amplitude of the second driving current Idb may be determined based on the gate voltage of the second driving transistor T1b. In one embodiment, for example, the amplitude of the second driving current Idb may be determined based on a difference between a gate-source voltage of the second driving transistor T1b and a threshold voltage of the second driving transistor T1b. The gate-source voltage of the second driving transistor T1b corresponds to a difference between the gate voltage and a source voltage. The third light-emitting element OLEDc may receive the second driving current Idb from the second driving transistor T1b and emit light corresponding to the amplitude of the second driving current Idb.

The scan transistor T2 may be configured to receive a data voltage D in response to a first scan signal GW. The scan transistor T2 may be configured to transmit the data voltage D to the source of the second driving transistor T1b in response to the first scan signal GW. The scan transistor T2 may include a gate connected to a first scan line GWL, a source connected to a data line DL, and a drain connected to the source of the second driving transistor T1b.

The storage capacitor Cst may be connected between the power line PL and the second driving transistor T1b. The storage capacitor Cst may include an upper electrode connected to the power line PL and a lower electrode connected to the gate of the second driving transistor T1b. The storage capacitor Cst may store a voltage corresponding to a difference between a first driving voltage ELVDD applied to the power line PL and the gate voltage of the second driving transistor T1b and may maintain the gate voltage of the second driving transistor T1b.

The compensation transistor T3 may be connected between the drain and the gate of the second driving transistor T1b and may connect the drain and the gate of the second driving transistor T1b in response to the first scan signal GW. The compensation transistor T3 may include a gate connected to the first scan line GWL, a source connected to the drain of the second driving transistor T1b, and a drain connected to the gate of the second driving transistor T1b. In an embodiment, the compensation transistor T3 may include a plurality of transistors which are connected in series and are simultaneously controlled by the first scan signal GW.

When the compensation transistor T3 is turned on in response to the first scan signal GW, the drain and gate of the second driving transistor T1b are connected to each other so that the second driving transistor T1b may be diode-connected. The data voltage D may be received from the source of the second driving transistor T1b through the scan transistor T2 in response to the first scan signal GW, and the data voltage D may be transmitted to the gate of the second driving transistor T1b through the diode-connected second driving transistor T1b. When the gate voltage of the second driving transistor T1b is equal to a voltage obtained by subtracting the threshold voltage of the second driving transistor T1b from the data voltage D, the second driving transistor T1b may be turned off, and the gate voltage of the second driving transistor T1b, which is equal to the voltage obtained by subtracting the threshold voltage of the second driving transistor T1b from the data voltage D, may be stored in the storage capacitor Cst.

The gate initialization transistor T4 may be configured to apply an initialization voltage VINT to the gate of the second driving transistor T1b in response to a second scan signal GI. The gate initialization transistor T4 may include a gate connected to a second signal line GIL, a source connected to the gate of the second driving transistor T1b, and a drain connected to a voltage line VL.

The anode initialization transistor T6 may be configured to apply the initialization voltage VINT to the anode of the third light-emitting element OLEDc in response to a third scan signal GB. The anode initialization transistor T6 may include a gate connected to the third signal line GBL, a source connected to the anode of the third light-emitting element OLEDc, and a drain connected to the voltage line VL.

The operation control transistor T5 may connect the power line PL to the source of the second driving transistor T1b in response to a third emission control signal EM3. The operation control transistor T5 may include a gate connected to a third emission control line EML3, a source connected to the power line PL, and a drain connected to the source of the second driving transistor T1b.

The third emission control transistor T7c may connect the drain of the second driving transistor T1b to the anode of the third light-emitting element OLEDc in response to the third emission control signal EM3. The third emission control transistor T7c may be configured to transmit the second driving current Idb output by the second driving transistor T1b to the anode of the third light-emitting element OLEDc. The third emission control transistor T7c may include a gate connected to the third emission control line EML3, a source connected to the drain of the second driving transistor T1b, and a drain connected to the anode of the third light-emitting element OLEDc.

Figure 8:
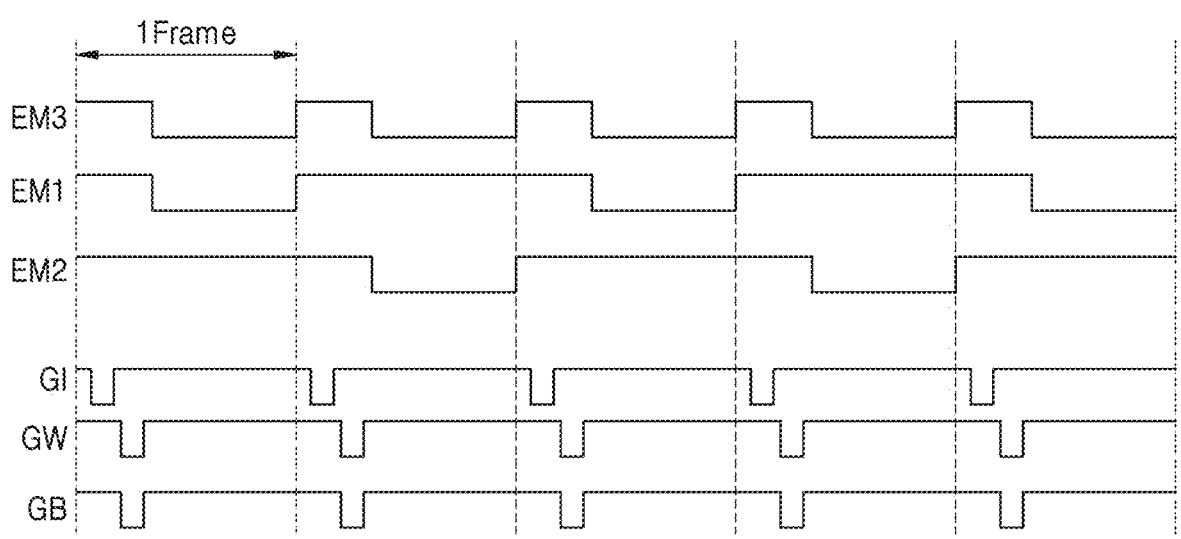
FIG. 8 is a signal timing diagram of control signals for driving light-emitting elements illustrated in FIGS. 4 and 7.

FIG. 8 is a signal timing diagram of control signals for driving light-emitting elements illustrated in FIGS. 4 and 7.

Referring to FIGS. 4, 7, and 8, during a period in which the third emission control signal EM3 has a high level, the operation control transistor T5 and the third emission control transistor T7c are turned off, and the third light-emitting element OLEDc does not emit light. The period in which the third emission control signal EM3 has the high level may be referred to as a non-emission period.

The second scan signal GI first has a low level. In this case, the gate initialization transistor T4 is turned on, and an initialization voltage VINT is applied to the gate of the second driving transistor T1b. A period in which the second scan signal GI has the low level may be referred to as a gate initialization period.

After the second scan signal GI transitions to a high level again, the first scan signal GW has a low level. In this case, the data voltage D is received through the data line DL, and the scan transistor T2 and the gate initialization transistor T4 are turned on so that the gate voltage corresponding to the data voltage D is stored in the storage capacitor Cst. A period in which the first scan signal GW has the low level may be referred to as a data writing period.

Then, the third scan signal GB has a low level. In this case, the anode initialization transistor T6 is turned on, and the initialization voltage VINT is applied to the anode of the third light-emitting element OLEDc. A period in which the third scan signal GB has the low level may be referred to as an anode initialization period.

Then, as the first scan signal GW and the third scan signal GB transition to a high level and the third emission control signal EM3 has a low level, the operation control transistor T5 and the third emission control transistor T7c are turned on. The second driving transistor T1b is configured to output a second driving current Idb based on the gate voltage stored in the storage capacitor Cst, and the third light-emitting element OLEDc emits light based on the second driving current Idb. A period in which the third emission control signal EM3 has the low level may be referred to as an emission period.

The second scan signal GI may be substantially synchronized with a first scan signal GW in a previous row. The third scan signal GB may be substantially synchronized with the first scan signal GW. In an embodiment, the third scan signal GB may be substantially synchronized with a first scan signal GW in a next row.

Hereinafter, a detailed operation process of a third pixel P3 of the display device 100 according to an embodiment will be described in detail.

First, when the third emission control signal EM3 having the high level is received, the operation control transistor T5 and the third emission control transistor T7c are turned off, the second driving transistor T1b stops outputting the second driving current Idb, and the third light-emitting element OLEDc stops emitting light.

Then, during the gate initialization period in which the second scan signal GI having the low level is received, the gate initialization transistor T4 is turned on, and the initialization voltage VINT is applied to the gate of the second driving transistor T1b, that is, the lower electrode of the storage capacitor Cst. A difference (ELVDD-VINT) between the first driving voltage ELVDD and the initialization voltage VINT is stored in the storage capacitor Cst.

Then, during the data writing period in which the first scan signal GW having the low level is received, the scan transistor T2 and the compensation transistor T3 are turned on, and the data voltage D is received by the source of the second driving transistor T1b. The second driving transistor T1b is diode-connected by the compensation transistor T3 and is biased in a forward direction. The gate voltage of the second driving transistor T1b increases at the initialization voltage VINT. When the gate voltage of the second driving transistor T1b is equal to a voltage (D−|Vth|) obtained by subtracting an absolute value of a threshold voltage (Vth) of the second driving transistor T1b from the data voltage D, the second driving transistor T1b is turned off, and the increase in the gate voltage of the second driving transistor T1b is stopped. Accordingly, the gate voltage of the second driving transistor T1b is D−|Vth|, and a difference (ELVDD−D+|Vth|) between the first driving voltage ELVDD and a gate voltage (D−|Vth|) is stored in the storage capacitor Cst.

Also, during the anode initialization period in which the third scan signal GB having the low level is received, the anode initialization transistor T6 is turned on, and the initialization voltage VINT is applied to the anode of the third light-emitting element OLEDc. The initialization voltage VINT is applied to the anode of the third light-emitting element OLEDc so that the third light-emitting element OLEDc does not completely emit light, thereby preventing the third light-emitting element OLEDc from finely emitting light in a next frame in response to the black grayscale.

Then, when the third emission control signal EM3 having the low level is received, the operation control transistor T5 and the third emission control transistor T7c are turned on, the second driving transistor T1b is configured to output the voltage stored in the storage capacitor Cst, that is, the second driving current Idb having an amplitude corresponding to a voltage (ELVDD−D), which is obtained by subtracting the absolute value of the threshold voltage (|Vth|) of the second driving transistor T1b from a source-gate voltage (ELVDD−D+|Vth|) of the second driving transistor T1b, and the third light-emitting element OLEDc may emit light with a luminance corresponding to the amplitude of the second driving current Idb.

During a period in which the third emission control signal EM3 and the first emission control signal EM1 have a high level, the operation control transistor T5 and the first emission control transistor T7a are turned off, and the first light-emitting element OLEDa does not emit light.

The second scan signal GI first has the low level. In this case, the gate initialization transistor T4 is turned on, and an initialization voltage VINT is applied to the gate of the first driving transistor T1a.

After the second scan signal GI transitions to the high level again, the first scan signal GW has the low level. In this case, the data voltage D is received through the data line DL, and the scan transistor T2 and the gate initialization transistor T4 are turned on so that the gate voltage corresponding to the data voltage D is stored in the storage capacitor Cst.

Then, the third scan signal GB has the low level. In this case, the first anode initialization transistor T6a is turned on, and the initialization voltage VINT is applied to the anode of the first light-emitting element OLEDa.

Then, as the first scan signal GW and the third scan signal GB transition to a high level and the third emission control signal EM3 and the first emission control signal EM1 have a low level, the operation control transistor T5 and the first emission control transistor T7a are turned on. The first driving transistor T1a is configured to output a first driving current Ida based on the gate voltage stored in the storage capacitor Cst, and the first light-emitting element OLEDa emits light based on the first driving current Ida.

Hereinafter, a detailed operation process of a first pixel P1 of the display device 100 according to an embodiment will be described in detail.

First, when the third emission control signal EM3 and the first emission control signal EM1 having the high level are received, the operation control transistor T5 and the first emission control transistor T7a are turned off, the first driving transistor T1a stops outputting the first driving current Ida, and the first light-emitting element OLEDa stops emitting light.

Then, during the gate initialization period in which the second scan signal GI having the low level is received, the gate initialization transistor T4 is turned on, and the initialization voltage VINT is applied to the gate of the first driving transistor T1a, that is, the lower electrode of the storage capacitor Cst. A difference (ELVDD-VINT) between the first driving voltage ELVDD and the initialization voltage VINT is stored in the storage capacitor Cst.

Then, during the data writing period in which the first scan signal GW having the low level is received, the scan transistor T2 and the compensation transistor T3 are turned on, and the data voltage D is received by the source of the first driving transistor T1a. The first driving transistor T1a is diode-connected by the compensation transistor T3 and is biased in a forward direction. The gate voltage of the first driving transistor T1a increases at the initialization voltage VINT. When the gate voltage of the first driving transistor T1a is equal to a voltage (D−|Vth|) obtained by subtracting an absolute vale of a threshold voltage (Vth) of the first driving transistor T1a from the data voltage D, the first driving transistor T1a is turned off, and the increase in the gate voltage of the first driving transistor T1a is stopped. Accordingly, the gate voltage of the first driving transistor T1a is D−|Vth|, and a difference (ELVDD-D+|Vth|) between the first driving voltage ELVDD and a gate voltage (D−|Vth|) is stored in the storage capacitor Cst.

Also, during the anode initialization period in which the third scan signal GB having the low level is received, the first anode initialization transistor T6a is turned on, and the initialization voltage VINT is applied to the anode of the first light-emitting element OLEDa. The initialization voltage VINT is applied to the anode of the first light-emitting element OLEDa so that the first light-emitting element OLEDa does not completely emit light, thereby preventing the first light-emitting element OLEDa from finely emitting light in a next frame in response to the black grayscale.

Then, when the third emission control signal EM3 and the first emission control signal EM1 having the low level are received, the operation control transistor T5 and the first emission control transistor T7a are turned on, the first driving transistor T1a is configured to output the voltage stored in the storage capacitor Cst, that is, the first driving current Ida having an amplitude corresponding to a voltage (ELVDD-D), which is obtained by subtracting the absolute value of the threshold voltage (|Vth|) of the first driving transistor T1a from a source-gate voltage (ELVDD-D+|Vth|) of the first driving transistor T1a, and the first light-emitting element OLEDa may emit light with a luminance corresponding to the amplitude of the first driving current Ida.

During a period in which the third emission control signal EM3 and the second emission control signal EM2 have a high level, the operation control transistor T5 and the second emission control transistor T7b are turned off, and the second light-emitting element OLEDb does not emit light.

The second scan signal GI first has the low level. In this case, the gate initialization transistor T4 is turned on, and an initialization voltage VINT is applied to the gate of the first driving transistor T1a.

After the second scan signal GI transitions to the high level again, the first scan signal GW has the low level. In this case, the data voltage D is received through the data line DL, and the scan transistor T2 and the gate initialization transistor T4 are turned on so that the gate voltage corresponding to the data voltage D is stored in the storage capacitor Cst.

Then, the third scan signal GB has the low level. In this case, the second anode initialization transistor T6b is turned on, and the initialization voltage VINT is applied to the anode of the second light-emitting element OLEDb.

Then, as the first scan signal GW and the third scan signal GB transition to a high level and the third emission control signal EM3 and the second emission control signal EM2 have a low level, the operation control transistor T5 and the second emission control transistor T7b are turned on. The first driving transistor T1a is configured to output a first driving current Ida based on the gate voltage stored in the storage capacitor Cst, and the second light-emitting element OLEDb emits light based on the first driving current Ida.

Hereinafter, a detailed operation process of a second pixel P2 of the display device 100 according to an embodiment will be described in detail.

First, when the third emission control signal EM3 and the second emission control signal EM2 having the high level are received, the operation control transistor T5 and the second emission control transistor T7b are turned off, the first driving transistor T1a stops outputting the first driving current Ida, and the second light-emitting element OLEDb stops emitting light.

Then, during the gate initialization period in which the second scan signal GI having the low level is received, the gate initialization transistor T4 is turned on, and the initialization voltage VINT is applied to the gate of the first driving transistor T1a, that is, the lower electrode of the storage capacitor Cst. A difference (ELVDD-VINT) between the first driving voltage ELVDD and the initialization voltage VINT is stored in the storage capacitor Cst.

Then, during the data writing period in which the first scan signal GW having the low level is received, the scan transistor T2 and the compensation transistor T3 are turned on, and the data voltage D is received by the source of the first driving transistor T1a. The first driving transistor T1a is diode-connected by the compensation transistor T3 and is biased in a forward direction. The gate voltage of the first driving transistor T1a increases at the initialization voltage VINT. When the gate voltage of the first driving transistor T1a is equal to a voltage (D−|Vth|) obtained by subtracting an absolute value of a threshold voltage (Vth) of the first driving transistor T1a from the data voltage D, the first driving transistor T1a is turned off, and the increase in the gate voltage of the first driving transistor T1a is stopped. Accordingly, the gate voltage of the first driving transistor T1a is D−|Vth|, and a difference (ELVDD-D+|Vth|) between the first driving voltage ELVDD and a gate voltage (D−|Vth|) is stored in the storage capacitor Cst.

Also, during the anode initialization period in which the third scan signal GB having the low level is received, the second anode initialization transistor T6b is turned on, and the initialization voltage VINT is applied to the anode of the second light-emitting element OLEDb. The initialization voltage VINT is applied to the anode of the second light-emitting element OLEDb so that the second light-emitting element OLEDb does not completely emit light, thereby preventing the second light-emitting element OLEDb from finely emitting light in a next frame in response to the black grayscale.

Then, when the third emission control signal EM3 and the second emission control signal EM2 having the low level are received, the operation control transistor T5 and the second emission control transistor T7b are turned on, the first driving transistor T1a is configured to output the voltage stored in the storage capacitor Cst, that is, the first driving current Ida having an amplitude corresponding to a voltage (ELVDD-D), which is obtained by subtracting the absolute value of the threshold voltage (|Vth|) of the first driving transistor T1a from a source-gate voltage (ELVDD-D+ |Vth|) of the first driving transistor T1a, and the second light-emitting element OLEDb may emit light with a luminance corresponding to the amplitude of the first driving current Ida.

In an embodiment, the first emission control signal EM1 having the low level and the second emission control signal EM2 having the low level may not be simultaneously received in a same frame. In such an embodiment, the first emission control signal EM1 having the low level may be received in a first frame, and the second emission control signal EM2 having the low level may be received in a next frame. Accordingly, the first pixel P1 and the second pixel P2 may not be simultaneously driven. In one embodiment, for example, the first light-emitting element OLEDa and the second light-emitting element OLEDb may not simultaneously emit light.

In an embodiment, a frame rate of the third display area DA3 may be equal to a sum of a frame rate of the first display area DA1 and a frame rate of the second display area DA2. In such an embodiment, because the third pixel P3 (or the third light-emitting element OLEDc) arranged in the third display area DA3 is driven (or emits light) in every frame and the first pixel P1 (or the first light-emitting element OLEDa) arranged in the first display area DA1 and the second pixel P2 (or the second light-emitting element OLEDb) arranged in the second display area DA2 are alternately driven (or emit light), the frame rate of the third display area DA3 may be equal to the sum of the frame rate of the first display area DA1 and the frame rate of the second display area DA2.

In an embodiment, the frame rate of the third display area DA3 may be greater than the frame rate of the first display area DA1. In one embodiment, for example, the frame rate of the third display area DA3 may be about two times the frame rate of the first display area DA1.

In an embodiment, the frame rate of the third display area DA3 may be greater than the frame rate of the second display area DA2. In one embodiment, for example, the frame rate of the third display area DA3 may be about two times the frame rate of the second display area DA2.

In an embodiment, a first pixel P1 may be arranged in the first display area DA1. The first pixel P1 may include a first pixel circuit PCa arranged in the first display area DA1, a first emission control transistor T7a arranged in the first display area DA1, and a first light-emitting element OLEDa arranged in the first display area DA1.

In an embodiment, a second pixel P2 may be arranged in the second display area DA2. The second pixel P2 may include a second pixel circuit PCb arranged in the first display area DA1, a second emission control transistor T7b arranged in the first display area DA1, and a second light-emitting element OLEDb arranged in the second display area DA2.

In an embodiment, the first pixel P1 arranged in the first display area DA1 and the second pixel P2 arranged in the second display area DA2 may share one first pixel circuit PCa arranged in the first display area DA1.

In such an embodiment, the first light-emitting element OLEDa arranged in the first display area DA1 and the second light-emitting element OLEDb arranged in the second display area DA2 may be driven by using one first pixel circuit PCa. In such an embodiment, the first light-emitting element OLEDa and the second light-emitting element OLEDb driven by using one first pixel circuit PCa may emit light having a same color. In one embodiment, for example, one first light-emitting element OLEDa that emits red light and one second light-emitting element OLEDb that emits red light may be driven by using one first pixel circuit PCa, one first light-emitting element OLEDa that emits green light and one second light-emitting element OLEDb that emits green light may be driven by using one first pixel circuit PCa, and one first light—that emits element OLEDa emitting blue light and one second light-emitting element OLEDb that emits blue light may be driven by using one first pixel circuit PCa.

When two light-emitting elements (e.g., the first light-emitting element OLEDa and the second light-emitting element OLEDb) emit light through the first driving current Ida output from one first pixel circuit PCa, an amplitude of the first driving current Ida applied to each light-emitting element (e.g., the first light-emitting element OLEDa and the second light-emitting element OLEDb) may be reduced. Because the amplitude of the first driving current Ida applied to each of the light-emitting elements (e.g., the first light-emitting element OLEDa and the second light-emitting element OLEDb) is reduced, resolutions of the first display area DA1 and the second display area DA2 in which the light-emitting elements (e.g., the first light-emitting element OLEDa and the second light-emitting element OLEDb) are arranged may be reduced.

In an embodiment, the gate driver 120 (see FIG. 3) may output the first emission control signal EM1 in a first operation mode and may output the second emission control signal EM2 in a second operation mode.

In such an embodiment, because the first emission control signal EM1 is output in the first operation mode, the first light-emitting element OLEDa may emit light in response to the first driving current Ida supplied through the first emission control transistor T7a in the first operation mode, and because the second emission control signal EM2 is output in the second operation mode, the second light-emitting element OLEDb may emit light in response to the first driving current Ida supplied through the second emission control transistor T7b in the second operation mode. In such an embodiment, an odd-numbered frame may operate in one of the first operation mode and the second operation mode, and an even-numbered frame may operate in the other of the first operation mode and the second operation mode. Therefore, the first light-emitting element OLEDa and the second light-emitting element OLEDb driven by one first pixel circuit PCa may be configured to emit light in different frames, rather than emitting light in a same frame. In such an embodiment, because the first light-emitting element OLEDa and the second light-emitting element OLEDb driven by one first pixel circuit PCa are configured to emit light in different frames, a decrease in the resolutions of the first display area DA1 and the second display area DA2 may be prevented or minimized.

According to one or more embodiments as described above, by separating and driving pixels (or light-emitting elements) in an area to which another function is added and an area adjacent to the area, resolutions of the areas may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a first light-emitting element disposed in a first display area;
   a second light-emitting element disposed in a second display area different from the first display area;
   a first pixel circuit disposed in the first display area, wherein the first pixel circuit outputs a first driving current for driving at least one selected from the first light-emitting element and the second light-emitting element;
   a first emission control transistor disposed in the first display area and which connects the first pixel circuit and the first emission control transistor to the first light-emitting element; and
   a second emission control transistor disposed in the first display area and which connects the first pixel circuit and the second emission control transistor to the second light-emitting element.

2. The display device of claim 1, wherein the first light-emitting element and the second light-emitting element emit light of a same color.

3. The display device of claim 1, wherein
   in a first operation mode, the first light-emitting element emits light in response to the first driving current supplied through the first emission control transistor, and
   in a second operation mode, the second light-emitting element emits light in response to the first driving current supplied through the second emission control transistor.

4. The display device of claim 3, wherein the display device operates in one of the first operation mode and the second operation mode in an odd-numbered frame and operates in the other of the first operation mode and the second operation mode in an even-numbered frame.

5. The display device of claim 3, further comprising:
   a gate driver which outputs a first emission control signal in the first operation mode and outputs a second emission control signal in the second operation mode.

6. The display device of claim 5, wherein
   the first pixel circuit includes a first driving transistor which controls an amplitude of the first driving current based on a gate-source voltage,
   the first emission control transistor connects the first driving transistor to the first light-emitting element in response to the first emission control signal, and
   the second emission control transistor connects the first driving transistor to the second light-emitting element in response to the second emission control signal.

7. The display device of claim 6, wherein the first pixel circuit further includes:
   a first operation control transistor which connects a power line to the first driving transistor in response to the first emission control signal, wherein the power line transmits a driving voltage; and
   a second operation control transistor which connects the power line to the first driving transistor in response to the second emission control signal.

8. The display device of claim 6, wherein the first pixel circuit further includes:
   a scan transistor which transmits a data voltage to the first driving transistor in response to a first scan signal; and
   a storage capacitor connected to the first driving transistor.

9. The display device of claim 6, wherein
   the first pixel circuit further includes an operation control transistor which connects a power line to the first driving transistor in response to a third emission control signal,
   wherein the power line transmits a driving voltage.

10. The display device of claim 9, wherein the third emission control signal is synchronized with at least one selected from the first emission control signal and the second emission control signal.

11. A display device comprising:
    a first light-emitting element disposed in a first display area;
    a second light-emitting element disposed in a second display area;
    a first pixel circuit disposed in the first display area, wherein the first pixel circuit outputs a first driving current for driving at least one selected from the first light-emitting element and the second light-emitting element;
    a first emission control transistor which connects the first pixel circuit to the first light-emitting element;
    a second emission control transistor which connects the first pixel circuit to the second light-emitting element;
    a third light-emitting element disposed in a third display area; and
    a second pixel circuit disposed in the third display area, wherein the second pixel circuit outputs a second driving current for driving the third light-emitting element.

12. The display device of claim 11, further comprising:
    a component disposed under the second display area,
    wherein the component includes a camera or a sensor.

13. The display device of claim 11, wherein the first display area is between the second display area and the third display area.

14. The display device of claim 11, further comprising:
    a third emission control transistor disposed in the third display area, wherein the third emission control transistor connects the second pixel circuit to the third light-emitting element.

15. The display device of claim 11, wherein a frame rate of the third display area is equal to a sum of a frame rate of the first display area and a frame rate of the second display area.

16. A display device comprising:
- a substrate on which a first display area, a second display area, and a third display area are defined, wherein the second display area is disposed inwardly from the first display area, and the third display area is disposed outwardly from the first display area;
- a first pixel circuit disposed on the substrate in the first display area;
- a first emission control transistor disposed on the substrate in the first display area and electrically connected to the first pixel circuit and a first light-emitting element disposed in the first display area; and
- a second emission control transistor disposed on the substrate in the first display area and electrically connected to the first pixel circuit and a second light-emitting element disposed in the second display area.

17. The display device of claim 16, wherein the first emission control transistor and the second emission control transistor are disposed on the substrate in the first display area.

18. The display device of claim 16 wherein the first emission control transistor connects the first pixel circuit to the first light-emitting element, and
- the second emission control transistor connects the first pixel circuit to the second light-emitting element.

19. The display device of claim 16, further comprising:
- a second pixel circuit disposed on the substrate in the third display area;
- a third light-emitting element disposed on the substrate in the third display area; and
- a third emission control transistor connected to the second pixel circuit,
- wherein the third emission control transistor connects the second pixel circuit to the third light-emitting element.

* * * * *